(12) United States Patent
Davis et al.

(10) Patent No.: US 6,420,905 B1
(45) Date of Patent: Jul. 16, 2002

(54) VENTED CMOS DYNAMIC LOGIC SYSTEM

(76) Inventors: John Haven Davis; Zachary Booth Simpson, both of 101 W. 33rd St., Austin, Travis County, TX (US) 78705

( * ) Notice: Subject to any disclaimer, the term of this patent is extended or adjusted under 35 U.S.C. 154(b) by 0 days.

(21) Appl. No.: 09/657,429

(22) Filed: Sep. 7, 2000

(51) Int. Cl.[7] .............................. H03K 19/094
(52) U.S. Cl. ...................... 326/113; 326/95; 326/96; 326/112
(58) Field of Search ................ 326/112, 113, 326/119, 121, 95–98

(56) References Cited

U.S. PATENT DOCUMENTS

| | | | |
|---|---|---|---|
| 5,369,316 A | 11/1994 | Chen et al. | 326/83 |
| 5,381,055 A | 1/1995 | Lai et al. | 326/27 |
| 5,382,844 A | 1/1995 | Knauer | 326/95 |
| 5,402,012 A | 3/1995 | Thomas | 326/97 |
| 5,402,081 A | 3/1995 | Wong et al. | 327/256 |
| 5,438,278 A | 8/1995 | Wong et al. | 326/27 |
| 5,440,182 A | 8/1995 | Dobbelaere | 326/38 |
| 5,440,243 A | 8/1995 | Lyon | 326/33 |
| 5,450,019 A | 9/1995 | McClure et al. | 326/28 |
| 5,483,181 A | 1/1996 | D'Souza | 326/98 |
| 5,491,428 A | 2/1996 | Pan | 326/17 |
| 5,508,640 A | 4/1996 | Partovi et al. | 326/98 |
| 5,517,136 A | 5/1996 | Harris et al. | 326/93 |
| 5,532,625 A | 7/1996 | Rajivan | 326/98 |
| 5,541,526 A | 7/1996 | Sandhu | 326/17 |
| 5,541,536 A | 7/1996 | Rajivan | 326/98 |
| 5,546,022 A | 8/1996 | D'Souza et al. | 326/87 |
| 5,559,465 A | 9/1996 | Shah | 327/374 |
| 5,602,497 A | 2/1997 | Thomas | 326/93 |
| 5,610,537 A | 3/1997 | Hastings | 326/59 |
| 5,614,846 A | 3/1997 | Pontius | 326/93 |
| 5,654,652 A | 8/1997 | Raza et al. | 327/17 |
| 5,661,411 A | 8/1997 | Nguyen | 326/21 |
| 5,698,994 A | 12/1997 | Tsuji | 326/83 |
| 5,703,501 A | 12/1997 | Geisler | 326/96 |
| 5,712,826 A | 1/1998 | Wong et al. | 365/226 |
| 5,717,355 A | 2/1998 | Martin | 327/374 |
| 5,777,497 A | 7/1998 | Han | 327/108 |
| 5,777,944 A | 7/1998 | Knaack et al. | 365/230.06 |
| 5,781,045 A | 7/1998 | Walia et al. | 327/108 |
| 5,852,373 A | 12/1998 | Chu et al. | 326/98 |

OTHER PUBLICATIONS

Robert Rogenmoser, "Circuit technique of the logic flip–flops," available via the Internet at http://www.guest.ii-s.ee.ethz.ch/~ror/research/cicc95/paper/node4.html, Jan. 26, 1996, 3 pp.

(List continued on next page.)

Primary Examiner—Michael Tokar
Assistant Examiner—Anh Tran
(74) Attorney, Agent, or Firm—Richard F. Frankeny; Winstead Sechrest & Minick P.C.

(57) ABSTRACT

A dynamic logic system is disclosed that uses transmission gates coupled between the inputs and output of inverting CMOS logic gates creating a "vented" CMOS logic gate (VCMOS). A clock is used to turn the transmission gates on during a pre-charge or "vent" cycle which causes the inputs and output of the VCMOS to go to an intermediate or vented state between a logic one and a logic zero. During an evaluation phase, inputs are applied to the VCMOS gate which will evaluate to a logic one or zero depending on the states of the inputs and the logic of the VCMOS gate. A family of vented CMOS gates are constructed by adding transmission gates in series with inputs or outputs to create input VCMOS (IVCMOS) and output VCMOS (OVCMOS) which are used to construct vented dynamic logic blocks (VDLB). A VDLB comprises groups of VCMOS gates which may be vented and isolated from other gates during venting. A vent comparator circuit is disclosed which may be used to detect when a VCMOS gate is in a logic or a vented state. The vent comparator is used with other logic to create pipeline logic structures with self-timed characteristics. The vent comparator is also used to signal when a vent cycle can be terminated and logic inputs can be applied for evaluation within a logic function employing VCMOS.

48 Claims, 23 Drawing Sheets

OTHER PUBLICATIONS

Chapter 4: Asynchronous Logic, available via the Internet at http://maveric0.uwaterloo.ca/amulet/staff/details/phil/scalp/thesis/chap4.html, 17 pp.

"Chapter 4: Asynchronous Logic," Found via Internet http://maveric0.uwaterloo.ca/amulet/staff/details/phil/scalp/thesis/chap4.html, pp. 1–17.

"Significant Hardware & Algorithmic Projects," Found via Internet http://swiftlet.ucsd.edu/~kimng/html/hardware.html, pp. 1–2.

"Circuit technique of the logic flip–flops," Found via Internet http://www.guest.iis.ee.ethz.ch/~roro/research/cicc95/paper/node4.html, pp. 1–3.

Dr. John H. Davis et al., "Energy Vented Logic," Dec. 22, 1999, pp. 1–4.

VENTED CMOS DYNAMIC LOGIC SYSTEM

TECHNICAL FIELD

The present invention relates in general to data processing systems and in particular, CMOS dynamic logic circuitry.

BACKGROUND INFORMATION

A logic circuit is a circuit designed to perform a particular logical function based on the concepts of "and," "not", "either-or," "neither-nor," etc. Normally these circuits operate between two discreet voltage levels, a logic one and logic zero, and are described as binary logic circuits.

Binary logic circuits are the basic building blocks of data processing systems and almost any electronic computing device. Binary logic circuits are extensively used in computers to carry out instructions and arithmetic processes as well as store information. Any logical procedure may be realized by using a suitable combination of these basic gates.

Because of their lower power dissipation, complementary metal-oxide-semiconductor (CMOS) field-effect transistors (FETs) are often used to construct such logic circuits, but are by no means the only implementation of such logic circuits.

Logic circuits are often cascaded in a number of connected stages and clock pulses are applied to the logic circuits to synchronize logic operations. FIG. 1 illustrates a logic circuit 100 which may implement a logic function having inputs Data In 101 and an output Data Out 102. A Clock 103 may be used as a means to synchronize or time when the particular states on the inputs of Data In 101 are to be evaluated by the logic gates in logic circuit 100 and outputted as Data Out 102. Other logic functions (not shown) may be static in nature and use no clocking scheme to synchronize operations. Rather, these logic functions operate to generate a combinatorial result based on inputs and the logic structure.

Although clocks are used to synchronize logic circuits, outputs are usually deemed valid until changed or updated by a subsequent clock state. Registers and latches are logic circuits that are typically clocked to enable outputs to be presented to succeeding circuits while remaining isolated from changing inputs until a clock state updates the contents.

There is another class of logic sometimes referred to as dynamic logic where gates have "valid" outputs during only one of the two logic states of a clock. During the second state of the clock, all of the logic gates are "pre-charged" to a specific voltage level. During the valid or first clock state, the logic gates "evaluate" or transition to the output states determined by inputs and the particular logic gate connections and structure. Dynamic logic is typically implemented with statically latched boundaries so that the outputs generated during an evaluation phase are not lost during a subsequent pre-charge phase.

Presently dynamic logic is used primarily to achieve an overall improvement in computation speed within processors. Paralleling logic circuits and pipelining various logic functions are techniques currently used to increase system speed. Dynamic logic is particularly suited to pipelined logic functions. In pipelined logic, a block of gates is used to determine a result which is then passed along to another block or stage of gates for further computation in a serial stream, called a "pipeline".

Dynamic logic, in this disclosure, is differentiated from traditional clocked logic. The dynamic logic, referred to in this disclosure, shares the features of the previously discussed pre-charge and evaluate phases. There are many varieties of dynamic logic that are in the prior art and they are all driven by a clock or clocks. A partial list of these are: CMOS Domino Logic, NP Domino Logic, Cascade Voltage Switch Logic, and PE Logic. A reference, *Principles of CMOS VLSI Design. A Systems Perspective*, by Neil H. Weste and Kamran Eshraghian, Addison Wesley Pub. Co., discusses dynamic logic.

It is usually desirable for a binary circuit to run as fast as possible. The ultimate speed of any binary logic circuit is fundamentally limited by the switching speed of individual logic gates in the circuit. The switching speed of individual logic gates is, in turn, limited by the amount of charge that must be transferred to change logic states as well as the maximum rate in which the charge transfer can be accomplished, i.e., the maximum current.

For the purposes of understanding the switching speed limitations of CMOS logic, refer to FIG. 2A, which is a schematic of a static CMOS binary circuit consisting of two inverters in series. The first inverter consists of a P-channel FET (PFET) 200 and N-channel FET (NFET) 204 and the second inverter consists of PFET 203 and NFET 206. The inverters are coupled creating a node Link 205. The timing diagram in FIG. 2B illustrates waveforms 207, 208, and 209 for the voltages at each of the nodes (Data In 201, Link 205 and Data Out 202) as the input voltage (Data In 201) on the first inverter transitions from a low to high voltage. Once the input Data In 201 supplies charge sufficient to establish a voltage greater than the threshold voltage (Vth1) of the NFET 204, it becomes conductive and the charge stored in the capacitance of node Link 205 is removed to ground. If the previous voltage level on node Link 205 was Vdd (power supply voltage) then additional charge is removed by NFET 204 to charge the capacitance between the gate of PFET 203 and Vdd. When the threshold voltage (Vth2) of PFET 203 is exceeded, then it conducts and begins charging the output node Data Out 202. This rather simple circuit illustrates the adding and removing of charge from nodes which is necessary for the operation of CMOS circuits. The FET devices charge and discharge the gate capacitances of the subsequent FETS. The time required for the gates to reach a voltage level is determined by the charge rate and the capacitances.

In a logic function comprising a group of logic gates with a set of inputs, not all of the gates will necessarily change from a present state when the set of inputs change logic states. The logic gates that do not change states require no time to generate their output since no transfer of charge is necessary to reach a valid state. If the logic gates in the logic function are dynamic with a pre-charge phase, the logic gates that remain in their pre-charged state during an evaluation will also require no time to generate their output since again no transfer of charge is necessary to reach a valid state. Although pre-charge will result in some gates having a minimum computation time, some gates will still require the time necessary to completely change states. In this sense conventional dynamic logic is asymmetrical; some gates make a full transition and some gates do not transition at all. It should be evident that even though some of the dynamic logic gates may have improved speed, it is never known how many gates will remain pre-charged or how many will change for a sequence of inputs. For this reason careful logic path selection and other techniques may be required to estimate and maximize the speed of a dynamic logic function.

Because speed in modem processors is very important, there is a need for selected dynamic logic functions with parallel computation paths and pipelined function architecture. There is therefore also a need for a dynamic logic that has a symmetrical operation resulting in faster logic gates with predictable and symmetrical gate switching times.

SUMMARY OF THE INVENTION

The present invention enables a logic circuit to run at a higher clock speed by minimizing the energy required for charge movement during evaluation. This is accomplished by causing the gate to transition to an intermediate voltage level during a pre-charge phase, henceforth referred to as "venting". The venting may be implemented in a variety of ways, but in general, a venting circuit is enabled by a clock (vent clock) which reduces a node charge resulting in a node voltage between a high and a low logic level, typically the mid-point.

In one embodiment of the present invention, each input node of an inverting complementary metal oxide silicon (CMOS) gate is connected to the output node using a complementary pair of field effect transistors (FETs) which form a bidirectional electronic switch commonly called a "transmission gate (TG)". When the vent clock is asserted to activate the TG (gating it to be conductive), the charge on either side of the logic gate (output to inputs) is brought into equilibrium resulting in a voltage level between a logic high and a logic low voltage. During this vent clock state, the logic gate no longer represents one of the normal binary states, but is rather "vented" to a neutral or intermediate logic state. The bidirectional electronic switches coupled between inputs and the output is referred to as a vent circuit. During a subsequent evaluation phase, before the input signal arrives, the vent circuit must be disabled. Once the vent circuit is disabled, the vented CMOS (VCMOS) logic gate made according to embodiments of the present invention, performs a logic operation. Outputs of the VCMOS logic, however, have to transition from the intermediate logic level either up to the power supply voltage (Vdd) or down to ground. All VCMOS gate outputs will transition equal amounts regardless of their previous state and are therefore symmetrical.

Embodiments of the present invention use additional electronic switches to isolate inputs or outputs of VCMOS gates. These additional electronic switches isolate the intermediate voltage state during venting and are used to create input VCMOS (IVCMOS) and output VCMOS (OVCMOS) gate structures. Other embodiments of the present invention use VCMOS, IVCMOS, and OVCMOS to produce a vented dynamic logic block (VDLB). The intermediate voltage state of a VCMOS may be differentiated from a corresponding CMOS logic one or a logic zero. Embodiments of the present invention use an intermediate logic level detector (vent detector) to indicate when venting or logic evaluation has completed. Other embodiments use the various vented logic structures along with vent detectors to create both clock timed and self-timed pipeline logic functions resulting in higher speed.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 22B is a timing diagram of the clocks for the circuit in FIG. 23A.

DETAILED DESCRIPTION

Figure 1:
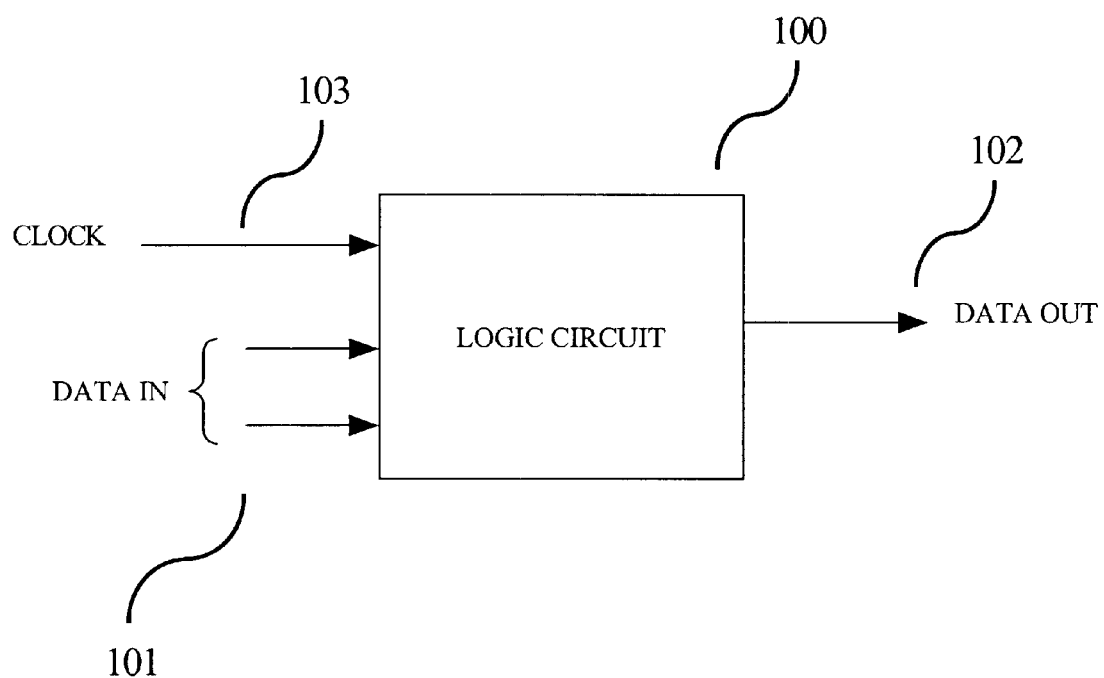
FIG. 1 illustrates a prior art logic circuit.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like may have been omitted inasmuch as such details are not necessary to obtain a complete understanding of the present invention and are within the skills of persons of ordinary skill in the relevant art. Throughout the detailed description the terms logic one will used to indicate a most positive state of a logic gate and a logic zero will indicate a most negative state for the same corresponding gate.

Refer now to the drawings wherein depicted elements are not necessarily shown to scale and wherein like or similar elements are designated by the same reference numeral through the several views.

Figure 3:
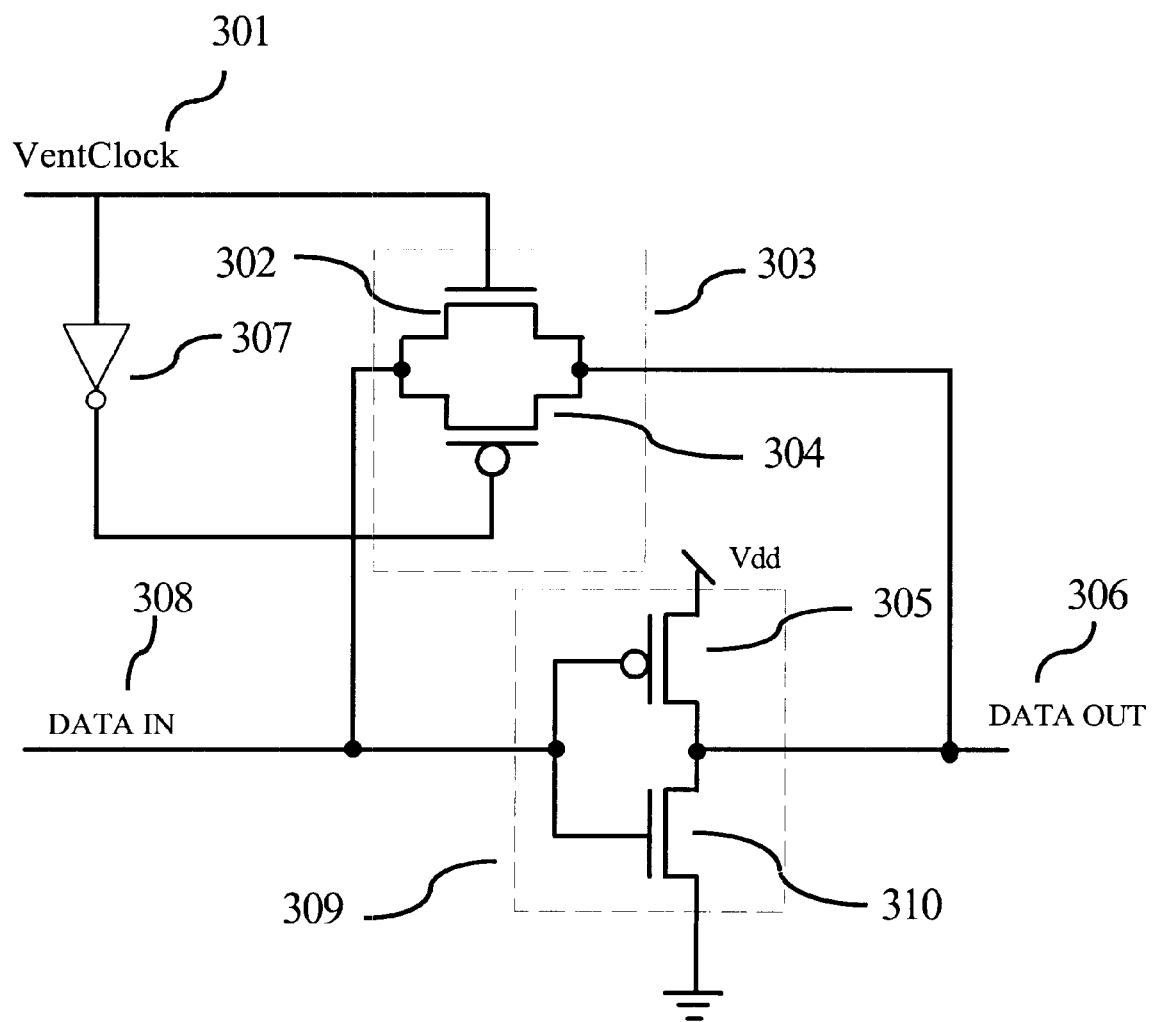
FIG. 3 illustrates a vented CMOS gate using embodiments of the present invention.

FIG. 3 is a circuit diagram of an embodiment of the present invention where a CMOS inverter 309 comprising P channel FET (PFET) 305 and N channel FET (NFET) 310 is coupled with a CMOS transmission gate 303 comprising parallel coupled PFET 304 and NFET 302. A reference book, *VLSI Design Techniques for Analog and Digital Circuits*, Randall L. Geiger, Phillip E. Allen, and Noel R. Stradler, McGraw Hill, 1990, has a discussion of the CMOS transmission gate on pages 563 and 564. The CMOS transmission gate may sometimes be referred to in this disclosure as just a transmission gate (TG). The TG referred to in this disclosure and illustrated in FIG. 3 as TG 303 requires a VentClock 301 and its complement generated by Inverter 307. It is convenient to refer to TG 303 as including Inverter 307 so only one VentClock 301 need be discussed. It should be obvious to one skilled in the art that other ways of generating VentClock 301 and its complement are possible without departing from the scope of the present invention. For this disclosure when a transmission gate (TG) is shown with only one clock input it will be understood that the TG includes the inverter to complement the clock signal.

TG 303 is gated conducting or non-conducting during one of the phases of VentClock 301. When TG 303 is not conducting, a logic level may be applied via Data In 308 driving the output, Data Out 306, to either a logic high or low level. When TG 303 is conducting, the input and output of inverter 309 will equalize (vent) to an intermediate voltage state between Vdd (power supply voltage) and ground. In this "vent" state, the Inverter 309 is in a linear mode with both NFET 310 and PFET 305 conducting. The vented Inverter 309, in this linear mode, is an amplifying device with negative feedback, therefore the intermediate voltage should be stable. It should be clear that when TG 303 is conducting, the input to inverter 309 should not be tied to a static logic gate (not shown) as the static logic gate would try to drive the intermediate voltage state to either Vdd or to ground. The input and output of inverter 309 may, however, be coupled to other compatible vented logic gates where all vented logic gates transition to the same intermediate voltage state during a pre-charge or venting phase.

Figure 4:
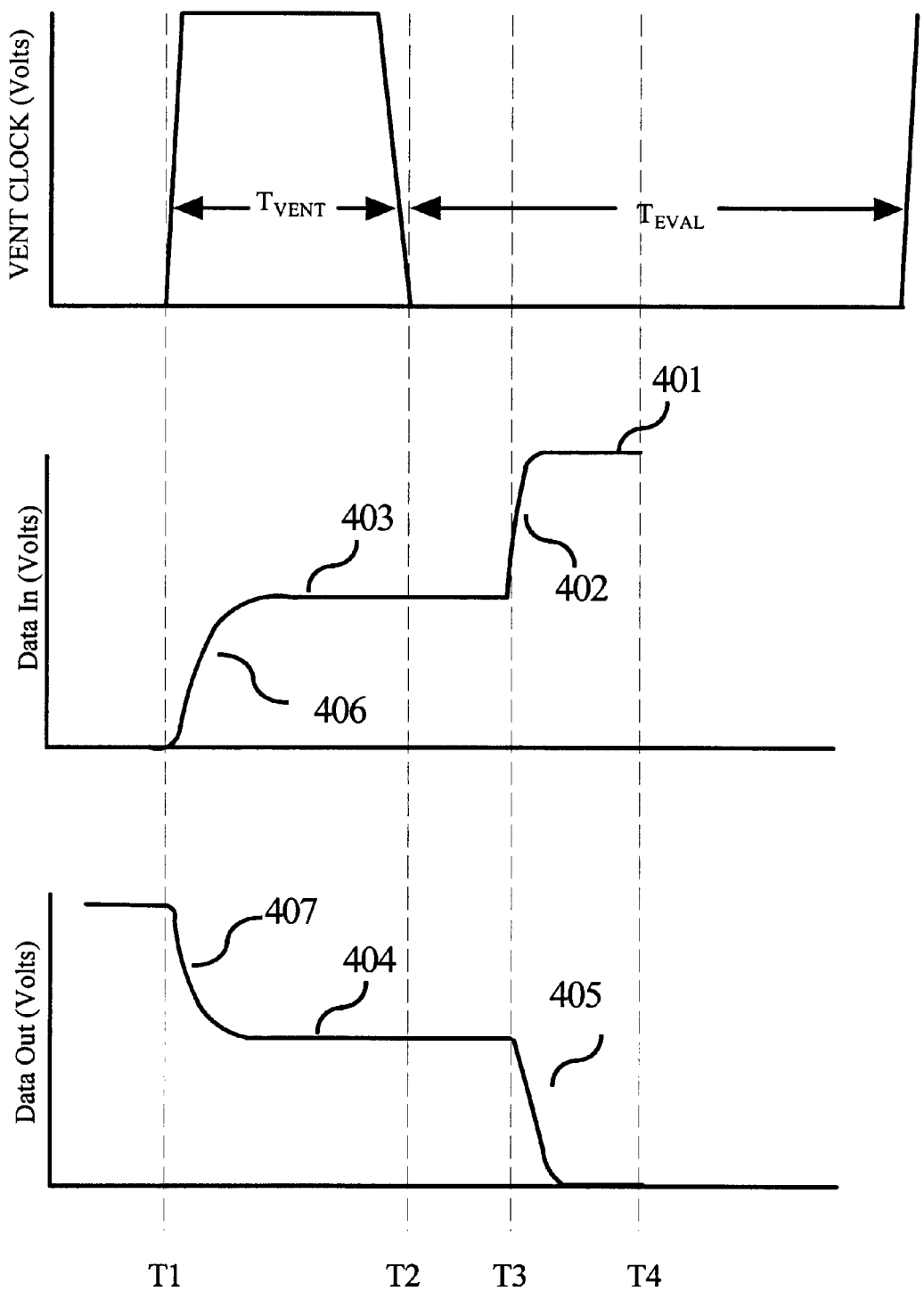
FIG. 4 is a voltage timing diagram of operation of the VCMOS gate of FIG. 3.

FIG. 4 is a timing diagram illustrating the logic states of the exemplary inverter 309 of FIG. 3 showing node voltage states before and after a vent cycle. Time marks T1, T2, T3, and T4 are used to indicate the events illustrated in FIG. 4. It is assumed in FIG. 4 that, prior to time T1, Data In 308 was in a logic zero state which set the output Data Out 306 to a logic one and the inverter 309 is in the evaluation phase (TG 303 is off). At time T1, Data In 308 is isolated (method not shown) from any input signal and VentClocks 301 turns on TG 303 causing the Data In 308 (transition 406) and Data Out 306 (transition 407) to equalize to a neutral or intermediate voltage (e.g., 403 and 404) between Vdd and ground.

VentClock 301 remains high holding the vent cycle from time Ti until time T3. At time T3, the VentClock 301 goes to a logic zero and TG 303 is gated off. Even though TG 303 is gated off, Data In 308 (voltage 403) and Data Out 306 (voltage 404) remain in the intermediate voltage state from time T2 until time T3. After venting and the turn off of TG 303, the input of inverter 309 is floating. However, because there is nothing to charge or discharge the input, the input (Data In 308) and the output node (Data Out 306) remain at the vented level. At time T4, a logic one (level 401) is re-applied (method not shown) to Data In 308 (transition 402) causing Data Out 306 to go to a logic zero (transition 405).

Figure 2A:
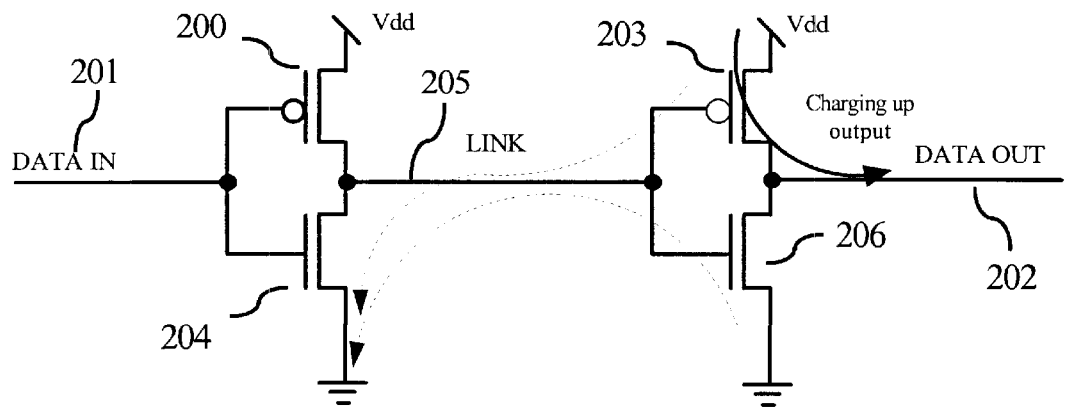
FIG. 2A is a schematic of a prior art static CMOS inverter.
Figure 2B:
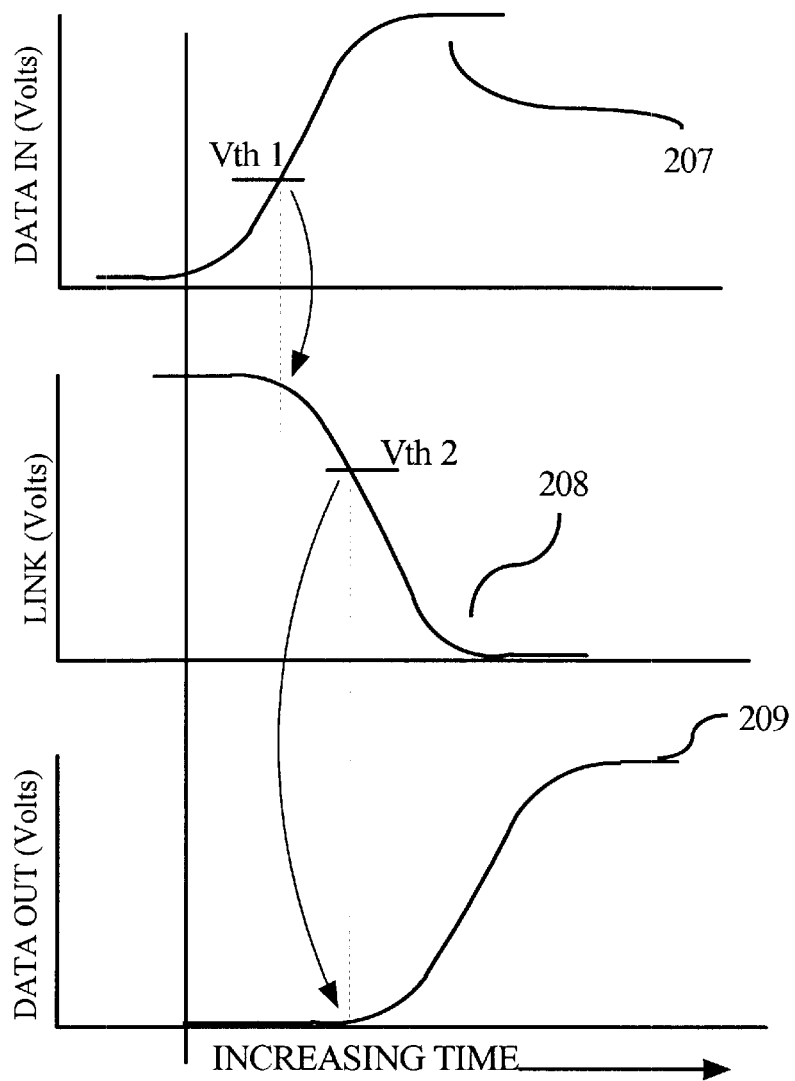
FIG. 2B is a voltage timing diagram of nodes of the prior art circuit in FIG. 2A.
Figure 21A:
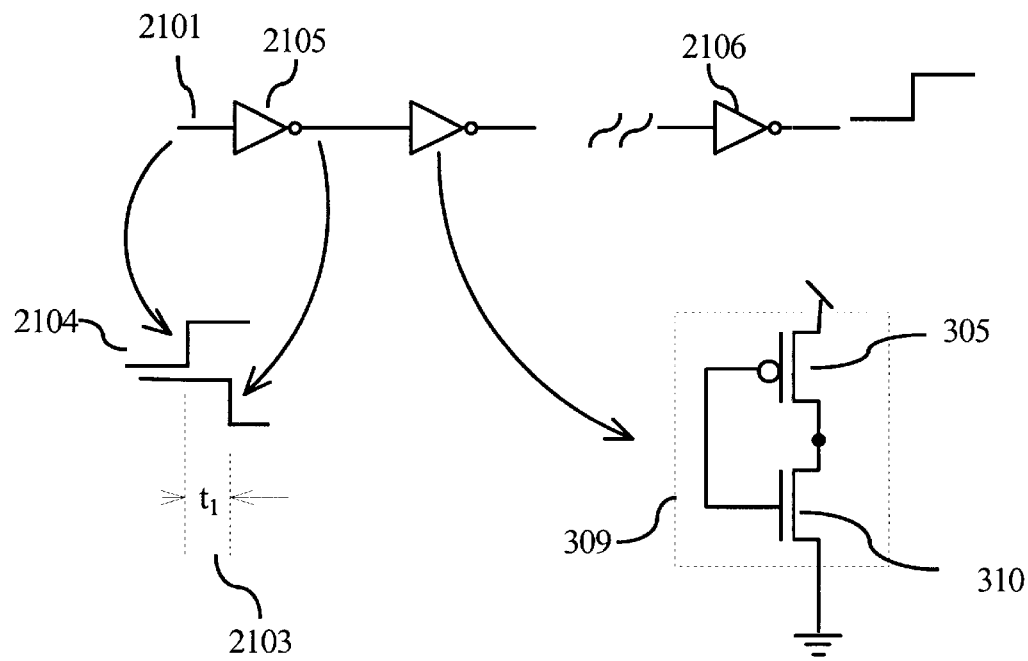
FIG. 21A is a circuit diagram of a group of series connected CMOS inverters and resulting waveforms.

If a number (N) of CMOS inverters, comparable to inverter 309, are coupled in series, see FIG. 21A, then the time required for a new input signal 2104 applied to the input 2101 of inverter 2105 to change the output level of the last inverter 2106 would be determined by the accumulative switching delay (e.g., $t_1$ 2103) through each of the inverters. This series of N inverters may be thought of as doing a computation, though a trivial one in this case. The series of inverters in this example is comparable to standard CMOS inverters and a transition on an input signal (e.g., 2104) applied to an inverter (e.g. 2105) would require some time to reach a threshold voltage. Before the threshold voltage is reached the output of the inverter 2105 will change little. After the threshold voltage is reached, a delay time is required before one the FETs (e.g., 305 and 310), making up the CMOS inverter 309, starts a transition toward conduction. The output of the inverter 2105 will require another delay time to get to the threshold voltage of the next stage and so forth down the chain. The total delay time from input to output of the conventional inverter string is the sum of the voltage transition times (e.g., $t_1$ 2103) for each individual inverter. Waveforms 207, 208 and 209 in FIG. 2B further illustrate this effect in a two inverter series connection.

Figure 21B:
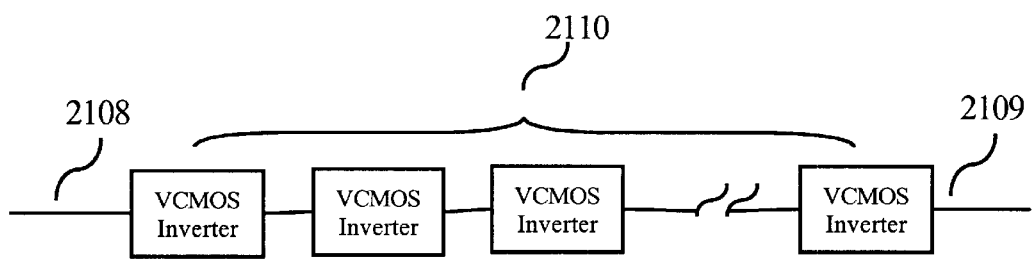
FIG. 21B is a diagram of a group of series connected VCMOS inverters.

A corresponding string of vented CMOS (VCMOS) inverters, illustrated in block diagram form in FIG. 21B and in detail in FIG. 3, has an entirely different operation. A new input is not applied until the VCMOS inverter string 2110 (series of inverters) has been vented and then the newly applied input state must propagate from input 2108 of the first inverter to the output 2109 of the last inverter in the VCMOS inverter string 2110. The total delay for a VCMOS inverter string 2110 is thus the vent time plus the sum of the delay times through each inverter in the VCMOS inverter string 2110 after an input is applied (evaluation phase). During the vent cycle, the intermediate voltage on each of the vented VCMOS inverters is above a CMOS threshold voltage. Once a full logic level is applied to the input of the first VCMOS inverter, the outputs of the first and succeeding VCMOS inverter stages start changing resulting in a much shorter delay time through the inverter string. In the VCMOS inverter string 2110, all the vented gates are, at once, in a linear operating region around the intermediate voltage level and only device delay and incremental charging of node capacitance delays an input change from immediately being propagated to an output; there is no wait for device thresholds to be reached.

Figure 5:
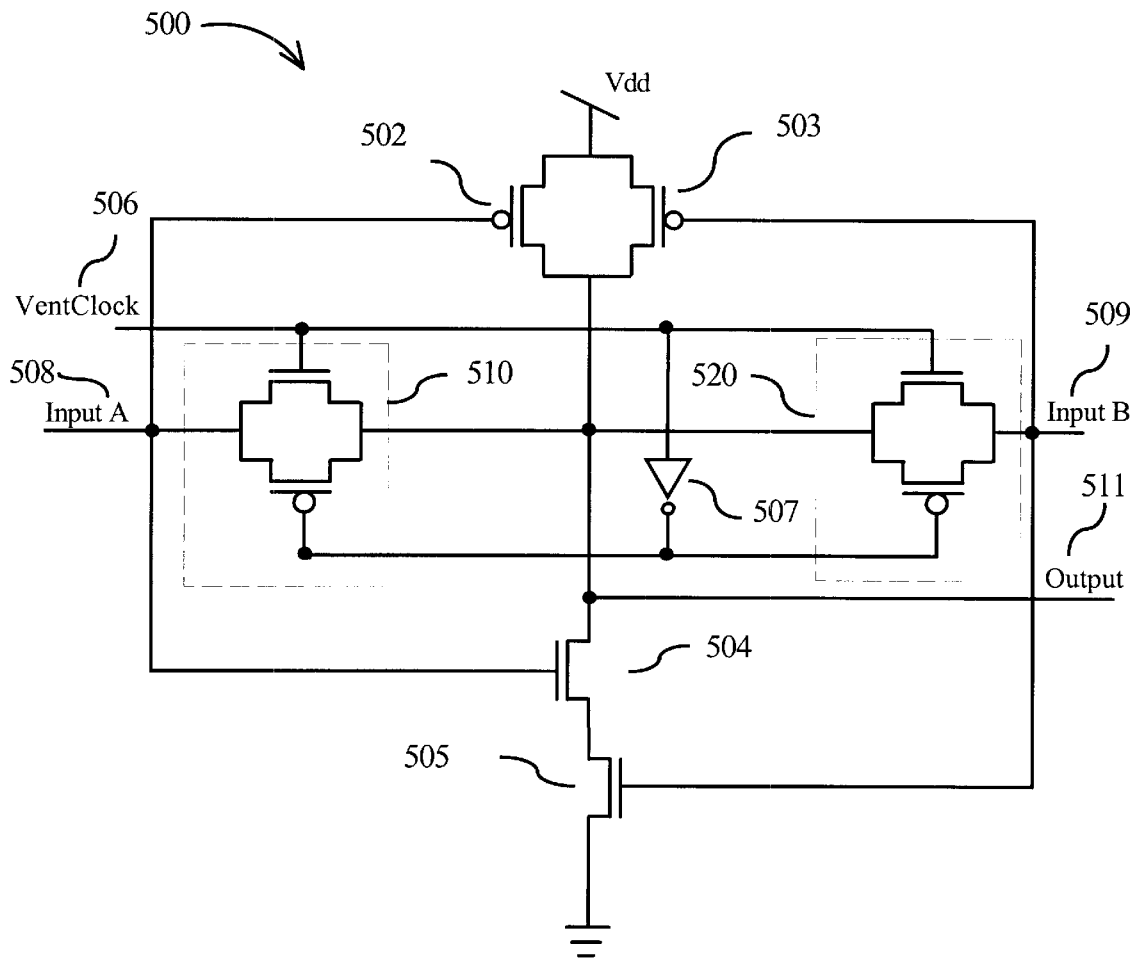
FIG. 5 is a VCMOS NAND gate using embodiments of the present invention.

The VCMOS logic, used in embodiments of the present invention, applies transmission gates as venting circuits around single stage inverting logic structures such as an INVERTER, NAND, or NOR logic block. FIG. 5 is a circuit diagram of a two input NAND gate 500 comprising parallel coupled PFETs 502 and 503 and series coupled NFETs 504 and 505. Transmission gates (TG) 510 and TG 520 are coupled from the output 511 to Input A 508 and Input B 509 respectively. TG 510 and TG 520 are turned on and off concurrently by VentClock 506. Inverter 507 generates the complement of VentClock 506 for TG 510 and TG 520. Operation of the vented NAND gate 500 is similar to that of the vented inverter in FIG. 3. If the Input A 508 and Input B 509 are coupled to non-vented logic (not shown) they would need to be isolated (method not shown) during the venting cycle. During venting, both Input A 508 and Input B 509 and the output (Out 511) transition to an intermediate voltage state (see FIG. 6). When TG 510 and TG 520 are turned off, the inputs (Input A 508 and Input B 509) and output (Out 511) will remain in the intermediate voltage state (floating) until new inputs are applied. When static CMOS logic levels are applied to Input A 508 (transition 602) and Input B 509 (transition 605), Out 511 will transition to a logic level (transition 606) determined by these input logic levels according to the logic of the NAND gate.

Figure 6:
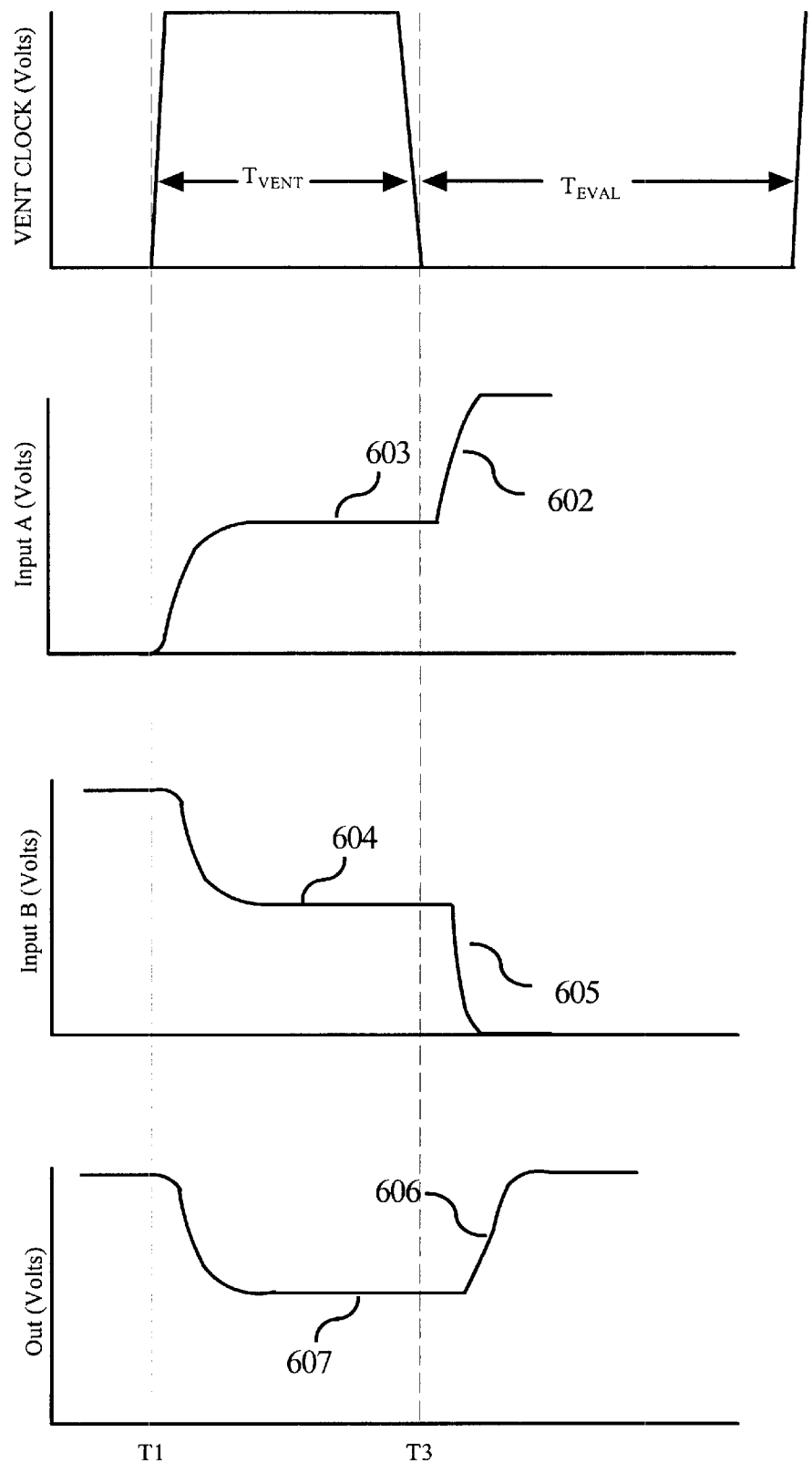
FIG. 6 is a voltage timing diagram of operation of the VCMOS gate of FIG. 5.

FIG. 6 is a timing diagram of the operation of the exemplary VCMOS NAND gate 500. In this example, Input A 508 is at a static logic zero and Input B 509 is at a static logic one before the venting phase. At time T1, VentClock 506 goes high turning on TG 510 and TG 520 causing the inputs and the output of VCMOS gate 500 to go to the intermediate or vented logic level (voltages 603, 604, and 607). At time T3, TG 510 and TG 520 are turned off enabling an evaluation cycle. When static CMOS logic inputs are applied to Input A 508 (transition 602) and Input B 509 (transition 605), Out 511 goes to a logic one (transition 606) determined by the inputs and the NAND function of VCMOS 500. The VentClock 506 waveform in FIG. 6 is shown with unequal logic one and logic zero duty cycles. In embodiments of the present invention, venting is done on a number of gates simultaneously as a parallel operation. Because venting is done in parallel, the time the clock must remain in the vent cycle may be shorter than the time needed to do an evaluation. Having the vent time shorter than the evaluation time is usually desirable for two reasons. First, during evaluation, a logic function is computing or presenting a value or result which is desired of the logic function, therefore the results of a logic operation are available for a longer period of time. Second, during a venting cycle the complementary devices implementing the CMOS logic gate are both conducting, and therefore a VCMOS gate will dissipate power during venting. This is unlike standard CMOS which only dissipates power during input and output transitions. During the evaluation phase, however, VCMOS has no power dissipation like standard static CMOS.

Figure 7A:
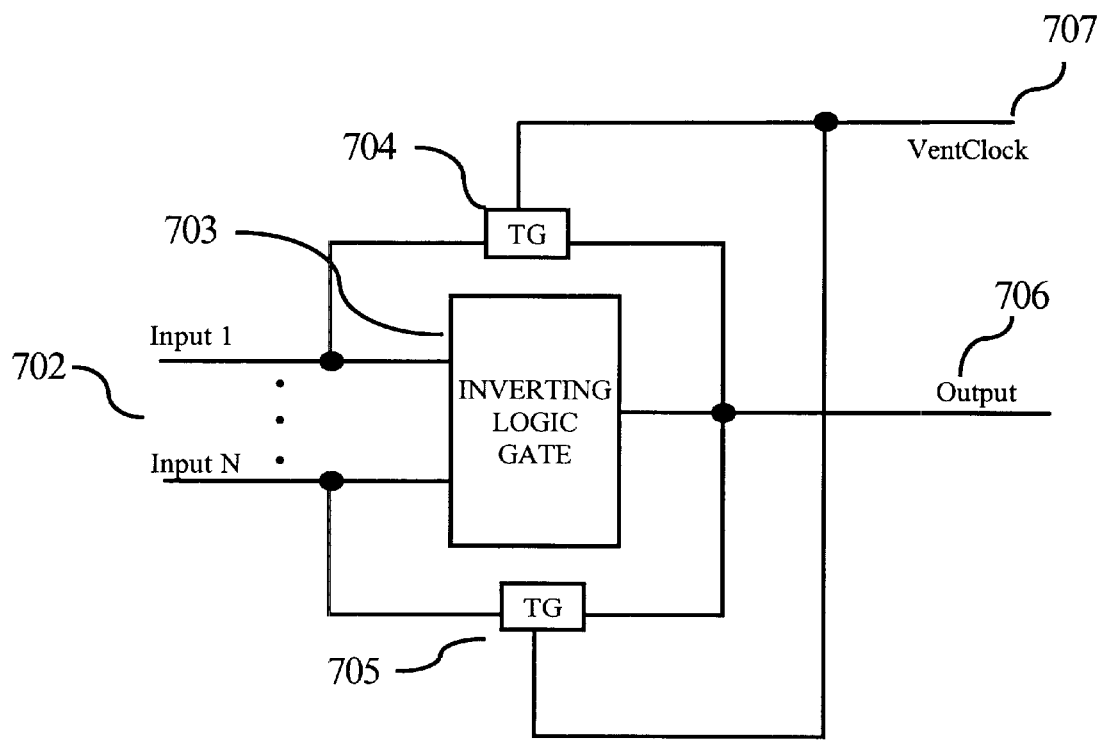
FIG. 7A and FIG. 7B illustrate diagrams of a generalized VCMOS gate.
Figure 7B:
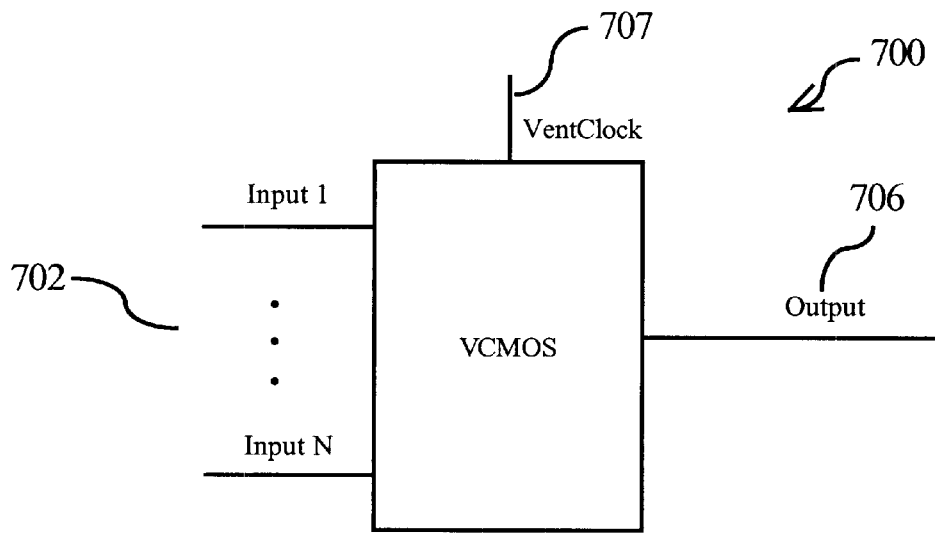

FIGS. 7A and 7B illustrate block diagrams for a generalized VCMOS gate used in embodiments of the present invention. An inverting logic gate 703 is shown with a number of inputs 702. Transmission gates TG 704 and TG 705 are shown coupling the output 706 to Input 1 and Input N respectively. A TG (e.g. 704 and 705) used to vent the CMOS logic gate 703, illustrated in FIG. 7A, would also require the complement of the VentClock 707 which is omitted in FIG. 7A for simplicity. It is understood that any other input (e.g., an Input K between Input 1 and Input N) not shown in FIG. 7A would also have a TG between output 706 and the input K. FIG. 7B illustrates a further simplified model for a VCMOS gate where only inputs 702 and output 706 and a VentClock 707 are shown to illustrate a generalized VCMOS gate 700. The VCMOS 700 model in FIG. 7B will enable the explanation of embodiments of the present invention to be simplified.

Figure 8A:
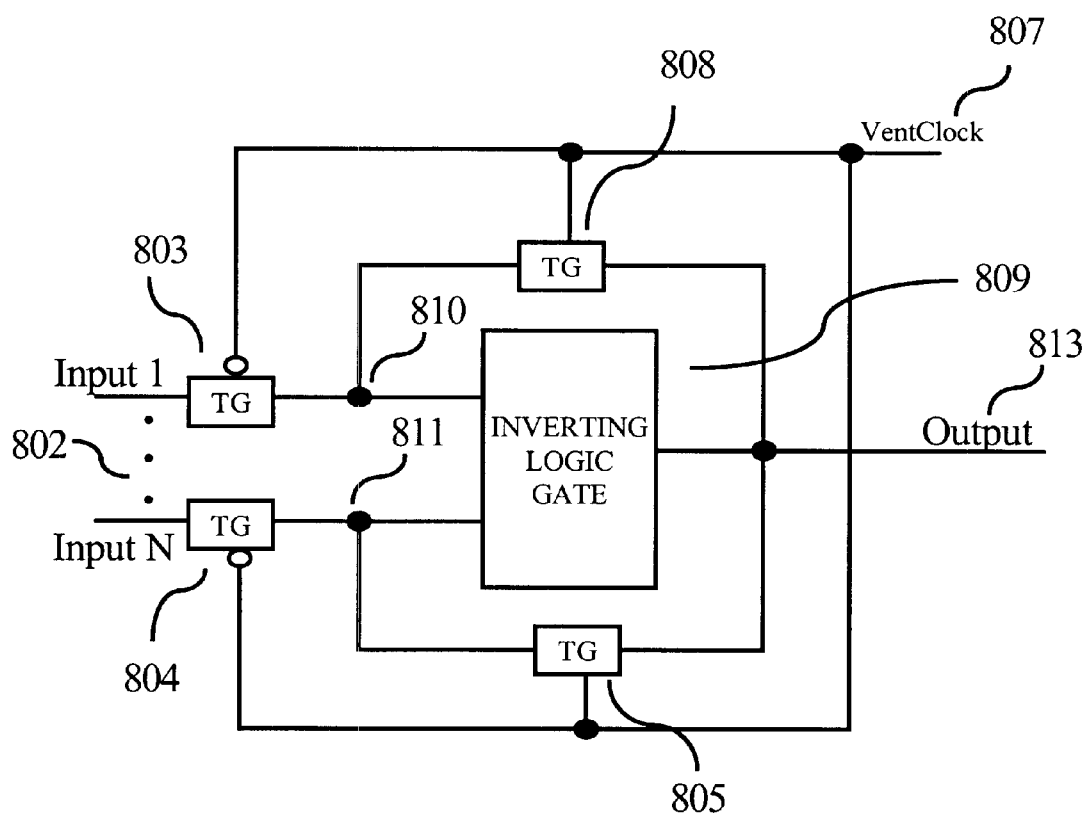
FIG. 8A and FIG. 8B illustrate block diagrams of a generalized input VCMOS gate.
Figure 8B:
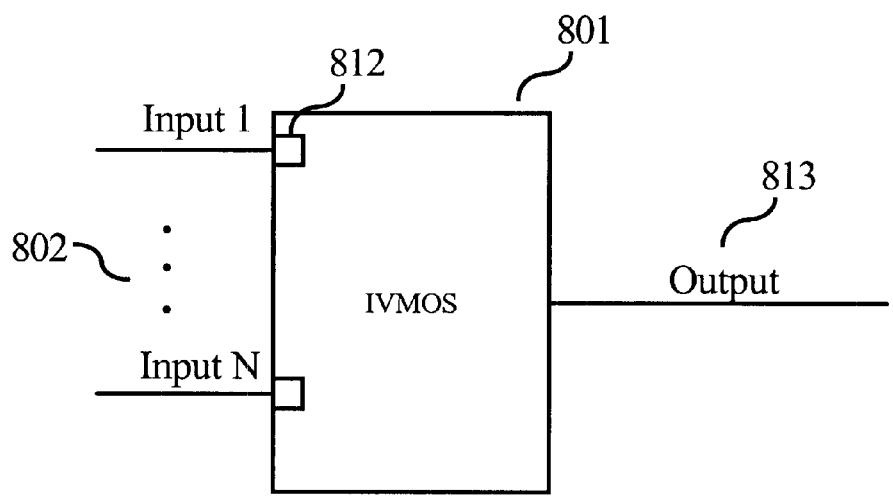

Using some of the short hand methods of FIGS. 7A and 7B, FIGS. 8A and 8B illustrate another embodiment of the present invention. In FIG. 8A, an inverting CMOS logic gate 809 has additional transmission gates TG 803 and TG 804. The addition of the open circle, on the VentClock input line 807 to TGS 804 and 805, is to illustrate that the operation of an input TG (e.g., 803 and 804) is opposite of a TG illustrated by TG 808 and TG 805 which are used to vent the CMOS logic gate 809. Transmission gates TG 803 and TG 804 are used to isolate the vented nodes (e.g., 810 and 811) of CMOS logic gate 809 from any external inputs during venting. This type of VCMOS gate is designated in this disclosure as an "input VCMOS" (IVCMOS). FIG. 8B is a block diagram of an WVCMOS 801 where squares 812 are used to indicate that transmission gates, comparable to TG 803 and TG 804 illustrated in FIG. 8A, are in series with all inputs 802 (Input 1 through Input N). In general, IVCMOS uses transmission gates to isolate its inputs (e.g. 810 and 811) but does not isolate its output (e.g., 813).

Figure 9A:
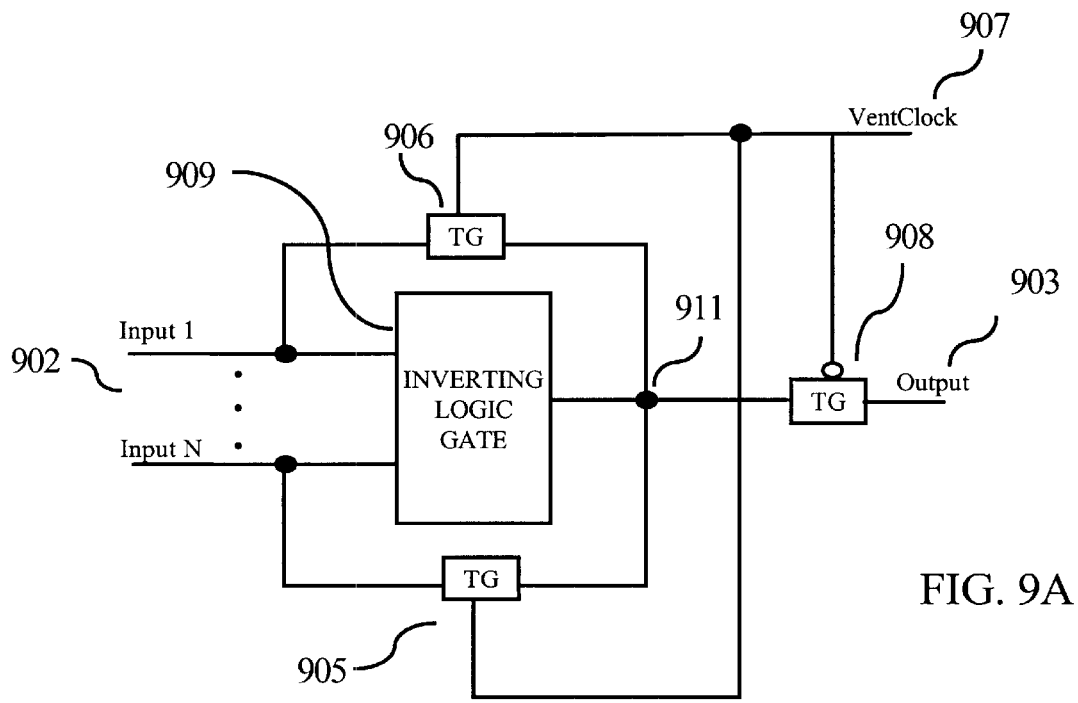
FIG. 9A and FIG. 9B illustrate block diagrams of a generalized output VCMOS gate.
Figure 9B:
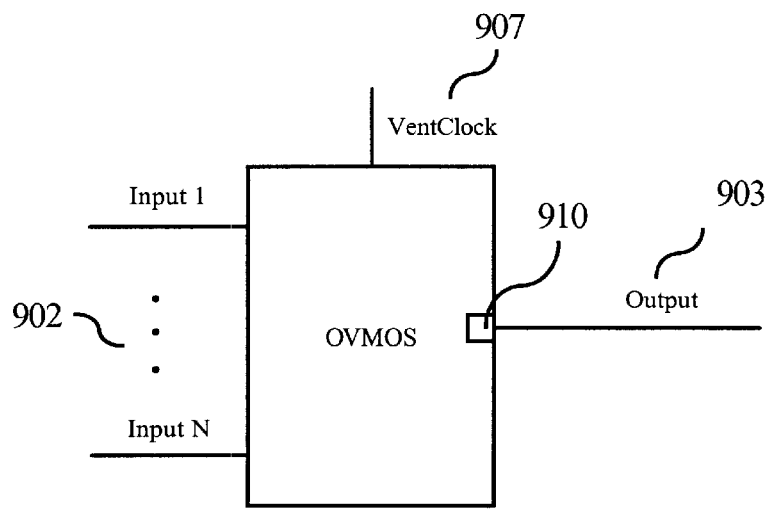

FIGS. 9A and 9B illustrate another embodiment of the present invention where an inverting CMOS logic gate 909 with exemplary venting transmission gates TG 906 and TG 905 are gated by VentClock 907. Additionally, a series transmission gate TG 908 is coupled to output 903. TG 908 serves to isolate the vented output node 911 of VCMOS 909 during a vent cycle; this feature is used to implement an "output vented CMOS" (OVCMOS) gate. TG 908 is also shown with a circle on its VentClock input to indicate that it operates in complement to exemplary transmission gates TG 906 and TG 905. FIG. 9B further illustrates a block diagram for an OVCMOS with inputs 902 and VentClock 907. The square 910 illustrates the addition of a series TG for selectively coupling output 903 to vented node 911. An OVCMOS gate may be used in embodiments of the present invention where it is desired to isolate output vented nodes from inputs of other logic gates.

Figure 10A:
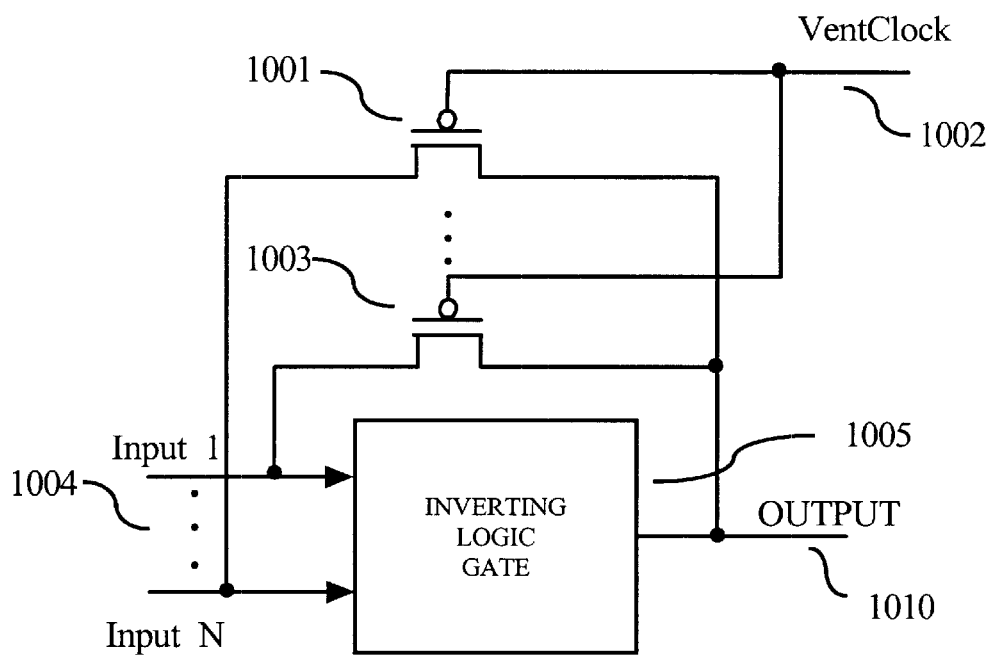
FIG. 10A and FIG. 10B illustrates an embodiment of the present invention using single FET transistors in the venting circuit.
Figure 10B:
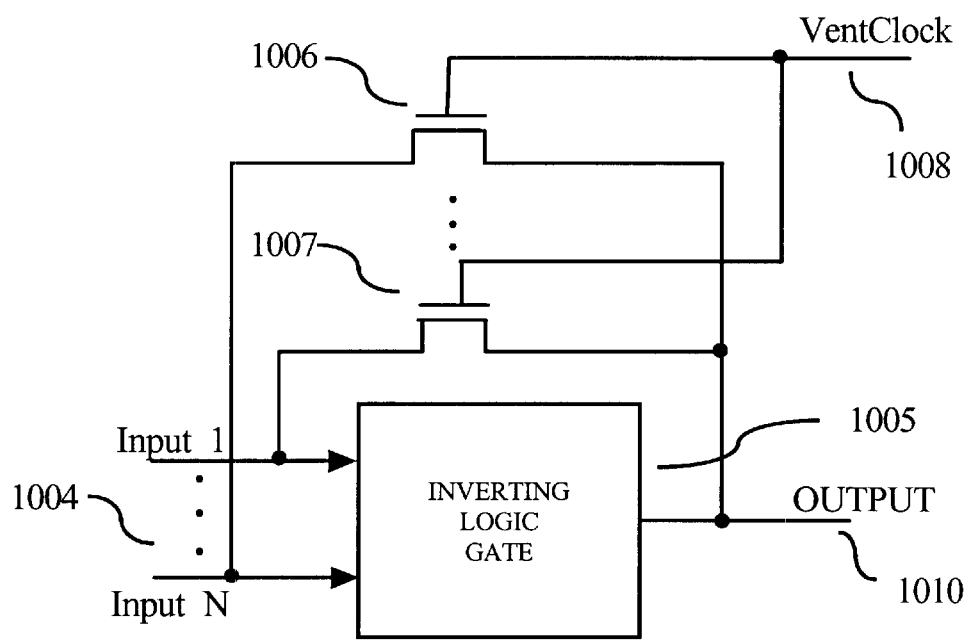

FIGS. 10A and 10B illustrate alternative embodiments for venting a CMOS inlogic gate. In FIG. 10A a CMOS logic gate 1005 with inputs 1004 and output 1010 uses exemplary PFET transistors 1001 and 1003 to vent input 1 and input N respectively. Other inputs (not shown) would also have similar PFET venting transistors. VentClock 1002 is used to gate vent PFET 1001 and 1003. Note that VentClock 1002 and VentClock 1008 would vent logic gate 1005 on opposite logic levels in FIGS. 10A and 10B respectively. FIG. 10B illustrates exemplary NFET 1006 and 1007 used to vent CMOS logic gate 1005. Other inputs (not shown) would have similar NFET venting transistors. Single PFET and NFET devices may also be used to create IVCMOS and OVCMOS according to embodiments of the present invention.

The specific voltage level that will result during the venting phase of a VCMOS logic gate, in embodiments of the present invention, is determined by the FET transistor sizes used to implement the circuits in the VCMOS logic gate. Circuit designers skilled in the art of CMOS logic gate design would readily know how to size particular combinations of PFETS and NFETS to create a particular intermediate voltage desired for a particular VCMOS gate design according to embodiments of the present invention.

Variations in an intermediate voltage level, not specifically a voltage halfway between a supply voltage and ground, would still be within the scope of the present invention even though an intermediate voltage level of one half the supply voltage may be desirable. Venting according to embodiments of the present invention require only that the input and output voltage levels during venting be the same although it may be desirable to have the vent level one half a supply voltage used for VCMOS gates.

As stated earlier, it may be desirable to isolate groups of VCMOS to limit the propagation of an intermediate voltage level during a venting cycle. Potential problems, which may result when cascading VCMOS gates, may be prevented by partitioning logic functions. VCMOS gates may be grouped for functional reasons or to enable the partitioning of vent clocks so as to better manage switching and power dissipation.

Figure 11A:
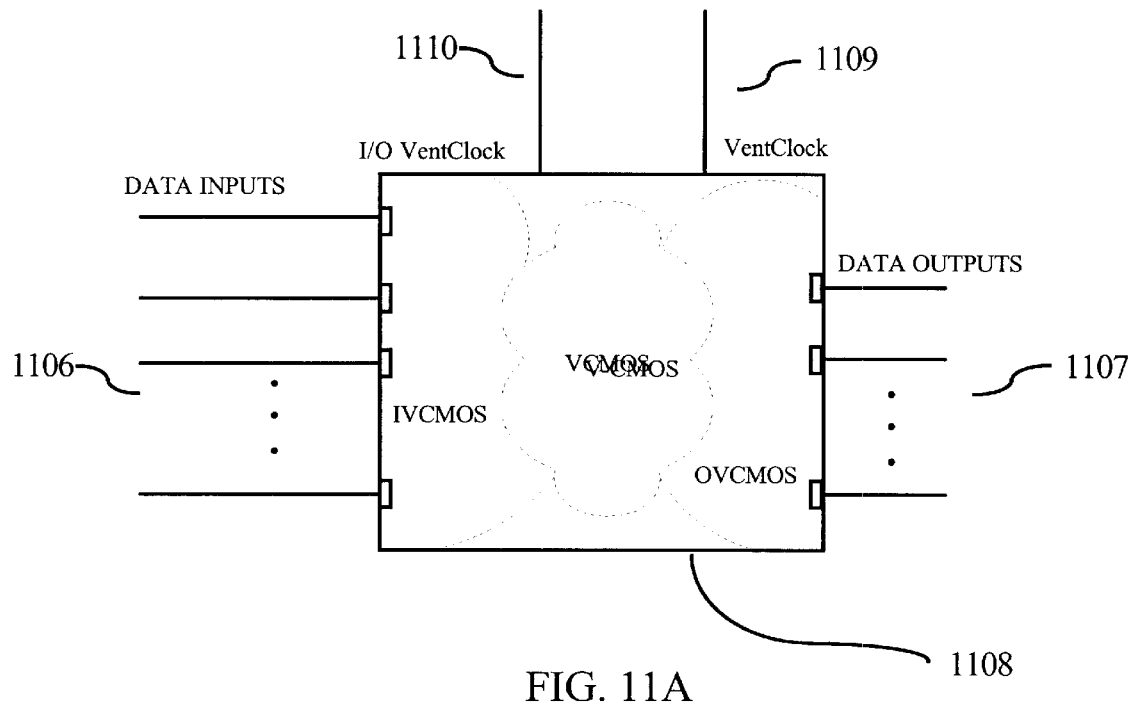
FIG. 11A. is a block diagram of a logic function using embodiments of the present invention.

FIG. 11A illustrates a logic sub-system 1108 comprised of IVCMOS, VCMOS and OVCMOS gates. This logic sub-system 1108 is designated in embodiments of the present invention as a "vented dynamic logic block" (VDLB). This group of logic gates is vented concurrently so as to be considered a vented CMOS sub-system that shares common vent clocks. All the Data Inputs 1106, coupled to VDLB 1108, are shown using previously illustrated (e.g., in FIGS. 8 and 9) input isolation (squares in series with inputs); Data Outputs 1107 are likewise shown with output isolation (squares in series with outputs).

Figure 11B:
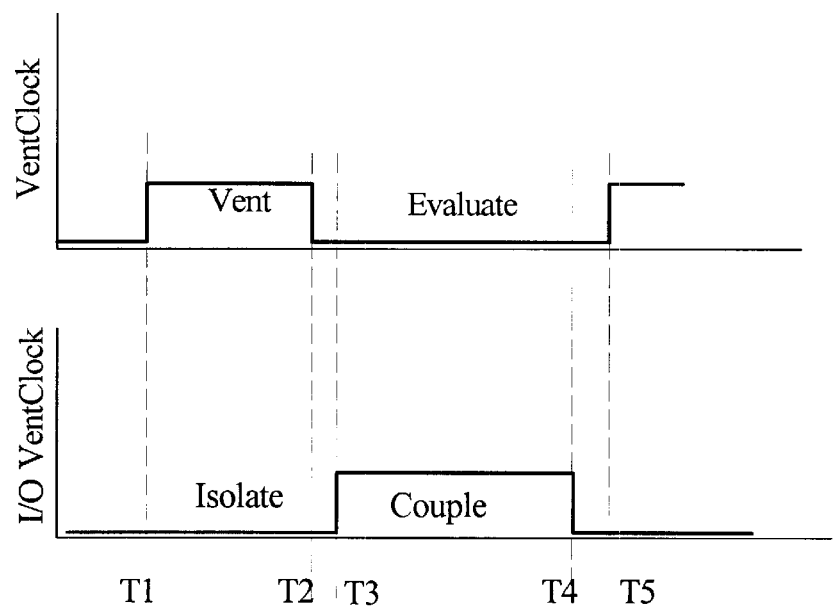
FIG. 11B is a timing diagram of the logic function of FIG. 11A.

An I/O VentClock 1110 is coupled to all the transmission gates (not shown) that are used to selectively isolate inputs 1106 and outputs 1107 during venting. FIG. 11B is a timing diagram illustrating the operation of VDLB 1108. VentClock 1109 gates a vent cycle when it is at a logic one and gates evaluation (switches off venting transmission gates) when it is at a logic zero. Likewise I/O VentClock 1110 couples Data inputs 1106 and Data outputs 1107 to VDLB 1108 when it is at a logic one and isolates inputs and outputs when it is a logic zero. In FIG. 11B, time T1 starts a vent cycle when inputs and outputs are already isolated (I/O VentClock 1110 at logic zero) and VCMOS gates internal to VDLB are vented (VentClock 1109 is at a logic one). VentClock 1109 is at a logic one long enough to guarantee that all gates in VDLB 1108 have vented and then it transitions back to a logic zero switching off all venting TGS (not shown). At time T3, I/O VentClock 1110 goes high and all inputs and outputs are coupled external to VDLB 1108 allowing the function implemented in VDLB 1108 to evaluate. The resulting output may be latched into static gates (not shown) coupled to outputs 1107 preceding time T4 when the outputs are again isolated. Latching results is done in preparation for a new vent cycle at time T5. The VCMOS gates in VDLB 1108 are vented in parallel during time T1 to T2. An evaluation, of applied inputs to VDLB 1108 during time T2 to T4, will occur faster than corresponding static CMOS gates implementing the same function. Static CMOS gates, implementing the same function, would apply inputs during one phase of a clock and typically latch the result on the other phase of the clock. The parallel nature of venting as well as faster time to evaluate or achieve a result, enables embodiments of the present invention to operate faster than corresponding static CMOS implementing the same function.

To improve the speed of function execution within a computer critical functions are sometimes implemented in logic structures known as logic "pipelines". Rather than having a single execution unit that has to wait for a result before another execution can occur, multiple execution units are pipelined (coupled end to end) so that certain operations requiring sequential instruction execution can process steps simultaneously. Operations may be overlapped by moving data or instructions through a conceptual pipeline with all logic stages of the pipeline processing simultaneously. For example, while one instruction is executed by a processor another is being decoded. In vector processors, several steps in a floating point operation may be processed simultaneously in a pipeline logic structure.

Figure 12:
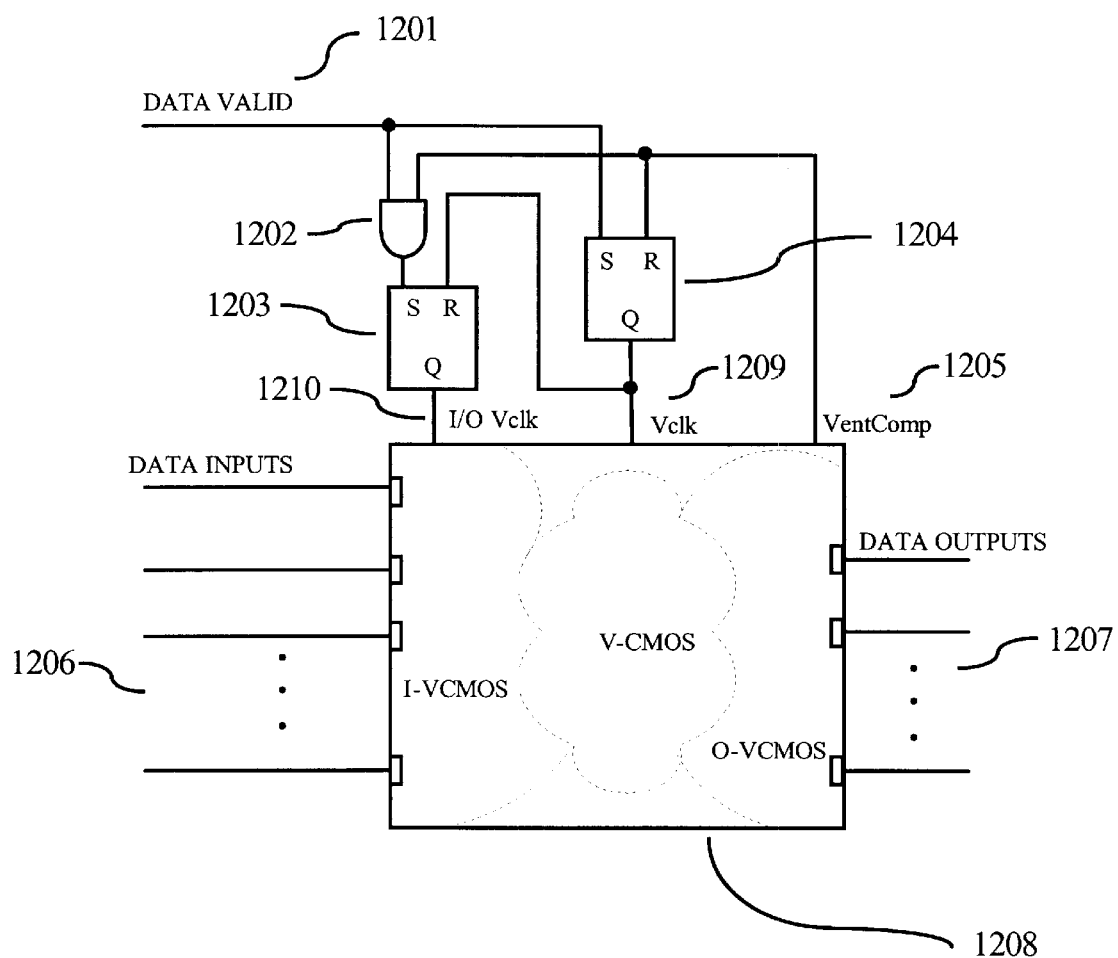
FIG. 12 is a block diagram of a circuit used to generate vent clocks in embodiments of the present invention.

FIG. 12 illustrates an embodiment of the present invention using a VDLB 1208 as in FIG. 11A. In this embodiment, exemplary logic gates 1202, 1203 and 1204 are used with a signal, VentComp 1205, to generate VentClock (Vclk)1209 and I/O Vclk 1210. Since all the VCMOS gates used to implement VDLB 1208 will exhibit an intermediate voltage state during venting that is distinctly different from a logic one or zero, the intermediate state may be detected and presented as VentComp 1205 (a vent comparator signal). The VentComp 1205 signal may be used to indicate when a selected VCMOS gate is in a vent state or in a valid logic state. An exemplary VentComp circuit (see FIG. 14) may be placed at a point within the VDLB 1208 so an indication of a vent or a logic state by VentComp 1205 may be used to signal VDLB 1208 when to start a vent, evaluation or input/output isolation cycle. A VentComp circuit is described in FIG. 14, however for the example circuit in FIG. 12 it will suffice to use the output (VentComp 1205) of such a vent comparator circuit (not shown in FIG. 12) that has a logic one output when a selected VCMOS logic gate is in a vent state and a logic zero output when the selected VCMOS logic gate is in a valid logic state, either a logic one or a logic zero.

Assume that in FIG. 12 a set of logic inputs to Data Inputs 1206 has just been processed and the VentComp 1205 is a logic zero indicating that all VCMOS gates are at valid logic levels. Static logic gates 1204 and 1203 are set/reset latches used to generate I/O Vclk 1210 and Vclk 1209. When VentComp 1205 transitions to a logic zero, the reset is removed from Latch 1204 and disables AND gate 1202 de-gating the input to the set input of Latch 1203. Latch 1203 was previously set when Data Inputs 1206 were applied. If Data Valid 1201 is a logic one, Latch 1204 is set causing Vclk 1209 to be asserted (transitions to a logic one) and resetting latch 1203 causing Data Inputs 1206 and Data Outputs 1207 to be isolated (function of IVCMOS and OVCMOS). When Vclk 1209 transitions to a logic one, a vent cycle is started and some time later VentComp 1205 will go to a logic one signaling that venting is complete, resetting latch 1204 and causing VentClock 1209 to transition to a logic zero ending the vent cycle. AND gate 1202 is then enabled and when Data Valid 1201 is a logic one, the I/O VentClock 1210 transitions to a logic one thereby coupling Data Inputs 1206 and starting a new evaluation cycle. In this manner, a Data Valid 1201 input alternately causes vent and evaluation cycles within VDLB 1208 in a somewhat self-timed mode. The fact that VCMOS has three voltage levels, a logic one, a logic zero, and a vent state, gives VCMOS a unique function over any other dynamic logic: the ability to signal when evaluation and vent or pre-charge have completed.

Figure 13:
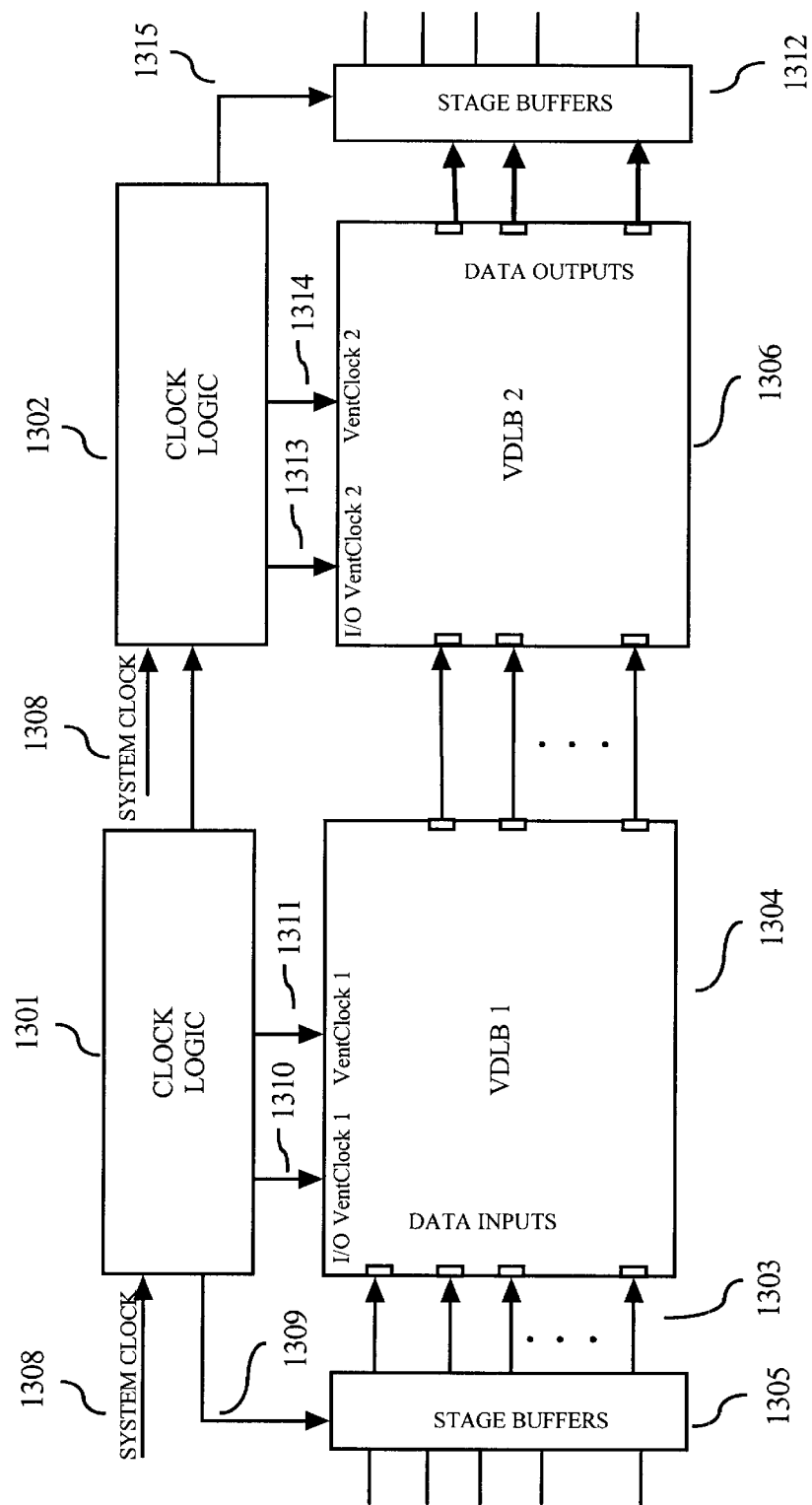
FIG. 13 is a block diagram of an embodiment of the present invention used to make a pipeline logic function.
Figure 16:
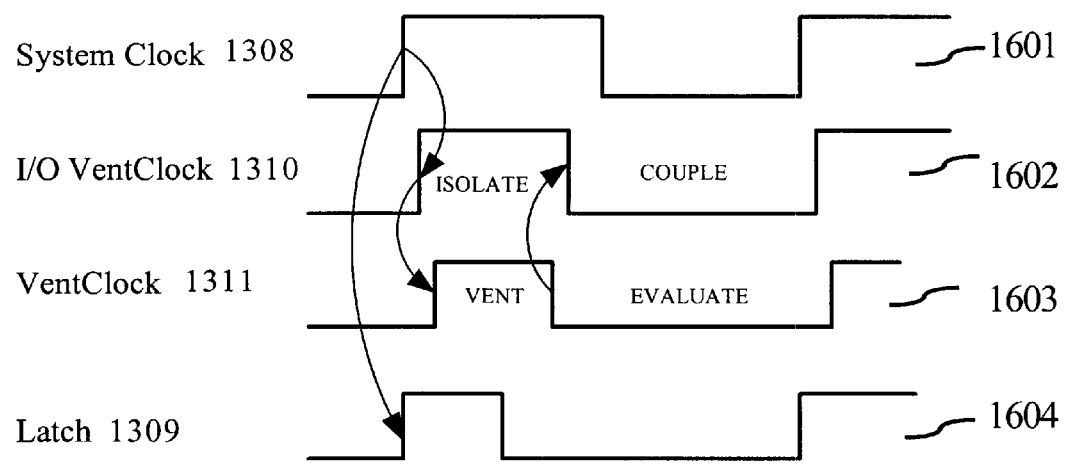
FIG. 16 is a timing diagram of the embodiment in FIG.13.

FIG. 13 is a circuit block diagram illustrating multiple VDLB stages (VDLB 1 and VDLB 2) which are coupled to stage buffers 1305 and 1312 to create a "pipelined vented pipeline logic block (PVDLB). Clock logic 1301 and 1302 generate timing for VDLB 1304 and 1306. Referring to FIG. 13 and FIG. 16, the System Clock 1308 starts the process by latching data in the master section of master/slave latch stage buffers 1305 and 1312 in response to the latch signals 1309 and 1315. After data is latched, the I/O VentClk 1310 transitions to a logic one which turns off input/output transmission gates (not shown) of IVCMOS and OVCMOS used to implement VDLB 1. This isolates the inputs and outputs so that vent logic states do not propagate outside of VDLB 1304. VentClk 1311 then gates on vent gates (not shown) that causes all logic gates in VDLB 1304 to transition to an intermediate state. After a time that insures all gates have fully vented, I/O VentClk 1310 gates transmission gates that couple all inputs and outputs to either a stage buffer (e.g., 1305) or to another VDLB (e.g., 1306). When VentClock 1311 transitions to a logic zero, signal 1309 causes the transfer of data in the master section of stage buffers 1305 to the slave section and presents these inputs as Data Inputs 1303. I/O VentClock 1310 then couples these inputs to the logic gates of VDLB 1304 which then evaluate to static CMOS logic states determined by inputs presented and the logic of VDLB 1304. Circuits in Clock Logic 1302 would generate VentClock 2 (1314), I/O VentClock 2 (1313), and latch signal 1315. System Clock 1308 subsequently triggers the storage of the logic result from the pipeline operation into stage buffer 1312. FIG. 16 illustrates the timing of the System Clock 1308 with timing 1601, I/O VentClock 1310 with timing 1602, VentClock 1311 with timing 1603 and Latch 1309 with timing 1604.

Figure 15:
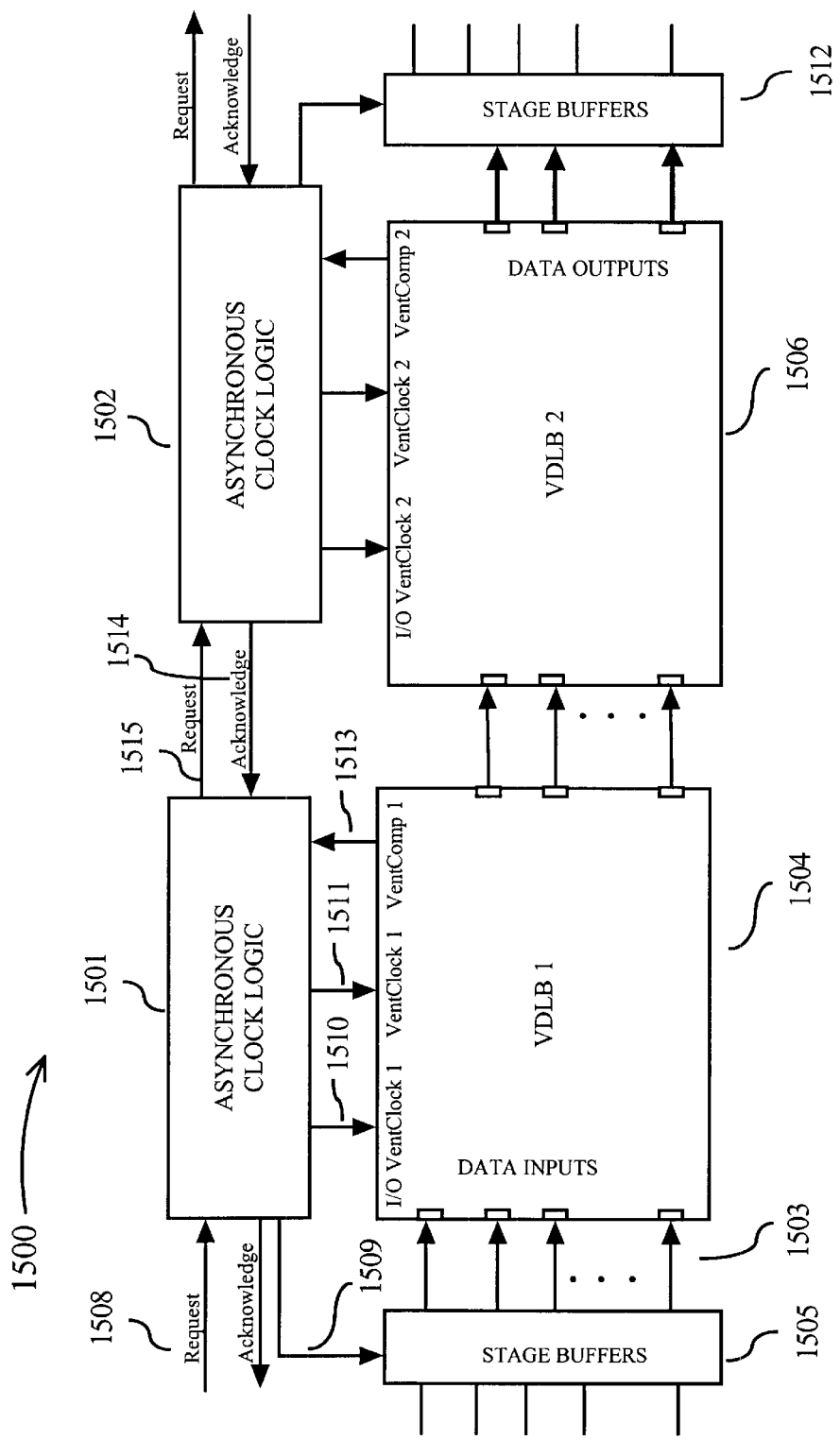
FIG. 15 is a block diagram of a self-timed pipeline logic function using embodiments of the present invention.
Figure 17:
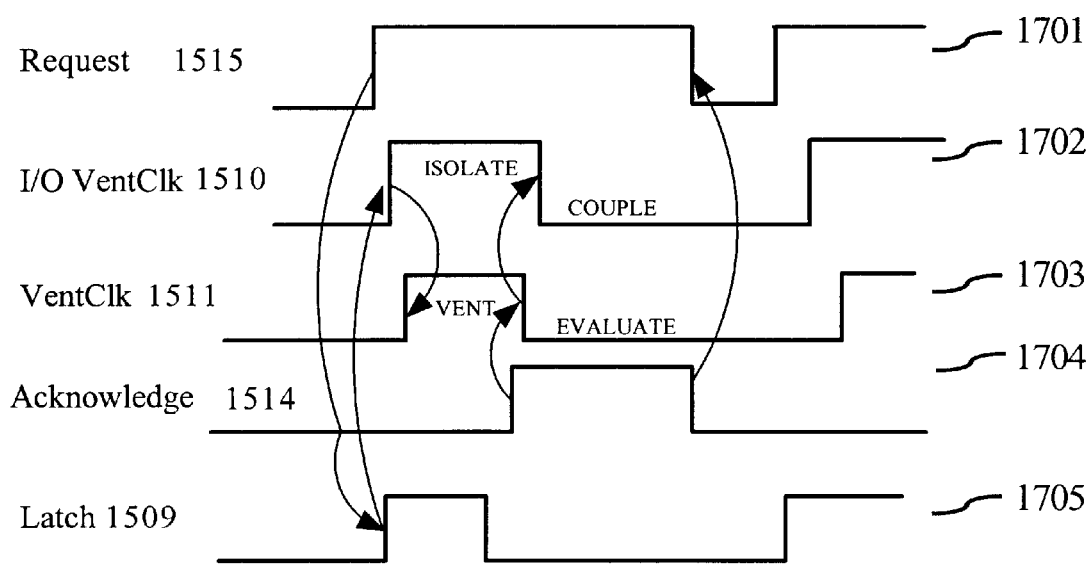
FIG. 17 is a timing diagram of the embodiment in FIG. 15.

FIG. 15 is another embodiment of the present invention with a pipeline logic structure 1500 comprising self-timed clock logic 1501 and 1502, stage buffers 1505 and 1512 and VDLB 1504 and 1506. Each VDLB may have an exemplary vent comparator signal (e.g., like VentComp 1513). Operations in this embodiment are controlled by Request 1508 and Acknowledge 1509 in place of the traditional clock signals. The timing diagram in FIG. 17 is used to illustrate operation of this embodiment of the present invention using a vent comparator within a pipeline logic structure. Operation of Request 1515 and Acknowledge 1514 are illustrated with timings 1701 and 1704 respectively. The timing of I/O VentClk 1510 and VentClk 1511 are shown with timings 1702 and 1703 respectively. The timing of Latch 1509 is shown with timing 1705.

Instead of a system clock, a Request 1508 would signal when data is present for processing by the pipeline logic structure 1500. The Request 1508 may trigger a signal 1509 that operates the transfer of data from a master to a slave stage in stage buffer 1505. Request 1508, combined with a logic zero VentComp 1513, may generate Latch signal 1509. The Latch signal 1509 would generate, in self time clock logic 1501, an I/O VentClk 1510. A logic zero value for VentComp 1513 indicates that the VDLB 1504 is in a logic state as opposed to a vent state. I/O VentClock 1510 isolates the inputs and outputs of VDLB 1504 and starts a venting cycle by triggering VentClock 1511. A vent cycle, indicated by a logic one VentComp 1513, will remain until a selected VCMOS gate (not shown but coupled to a vent comparator) in VDLB 1504 has completed venting (VentComp 1513 goes to a logic one in transition 1706). The ending of the vent cycle (VentClock 1511 transitions to a logic zero) switches the I/O VentClock 1510 to a logic one thereby coupling its inputs 1503 to the pipeline logic structure 1500 and starting an evaluation cycle. The VentComp 1513 transitions to a logic zero (transition 1707) when a selected VCMOS gate in VDLB 1504 completes evaluation or arrives at a static CMOS logic state. Sometime later the Request 1508 goes low while stage buffer 1505 has new data latched into its master section. When Request 1508 again transitions to a logic one, another pipeline processing cycle will be executed. In this embodiment of the present invention there is no actual synchronous clocking but rather a data valid signal along with a vent comparator signal are combined in a self-timed logic block (e.g., logic 1501) to start and complete a processing cycle. A vent comparator enables a determination of when a venting or pre-charge cycle completes and likewise when an evaluation of a computation cycle has completed The vent comparator function is unique to this VCMOS logic according to embodiments of the present invention.

Figure 18:
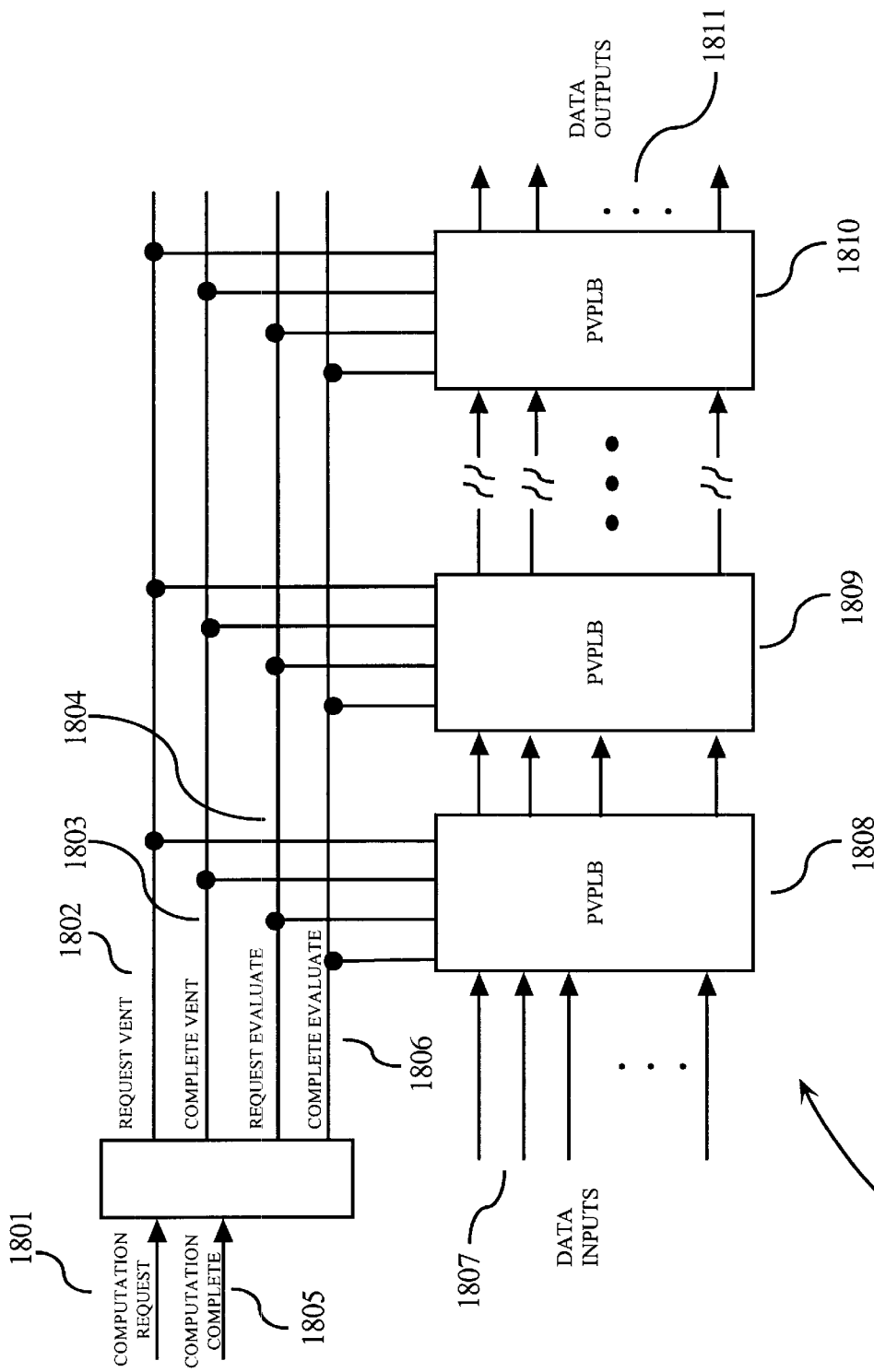
FIG. 18 is a block diagram of a multi-stage pipeline vented dynamic logic function using embodiments of the present invention.

Another embodiment of the present invention is illustrated in FIG. 18. In this embodiment a number of Pipe Lined Vented Dynamic Logic Blocks (PVDLB 1808, 1809 and 1810) are coupled together to make a Multi-Stage Pipeline Vented Dynamic Logic Block (MVSPVDLB 1800. Typically the individual PVDLB (e.g., 1808) perform different functions and as such may each have different computation times. A MSPVDLB 1800 would require a number of cycles for the pipeline to be filled. After the MSPVDLB is filled, each time new data inputs 1807 are applied and a new output, which had traversed all the processing stages, would exit Data Outputs 1811. Typically a MSPVDLB 1800 would be clocked to guarantee the slowest block had evaluated before a new cycle was initiated. Since processing speed varies from chip to chip, the clock time may need to be made variable. In embodiments of the present invention, a Computation Request 1801 is made by a system (not shown) and converted to signals, RequestVent 1802 and CompleteVent 1803. CompleteVent 1803 would be initially pre-charged high. As the RequestVent 1802 signal propagates to each pipeline stage, a vent cycle within that each stage would commence. In one embodiment of the present invention a pull down device (not shown) in each stage, coupled to the CompleteVent 1803, would be turned on by RequestVent 1802. Since each PVDLB turns on its pull down device coupled to CompleteVent 1803 signal line, CompleteVent 1803 remains low until the last stage to vent releases its pull down device. CompleteVent 1803 would remain low until every stage in MSPVDLB 1800 had vented (signaled by vent comparators) at which time it would go high. When CompleteVent 1803 goes high, it would start a RequestEvaluate 1804 which would initiate an evaluate cycle concurrently in every stage of MSPVDLB 1800. Like CompleteVent 1803, a CompleteEvaluate 1806 signal would also be pre-charged high. Again as each stage enters an evaluate cycle in parallel (delayed only by the time for a RequestEvaluate to propagate to all stages) pull downs devices in each pipeline stage would turn on and in turn hold CompleteEvaluate 1806 low until the last stage had completed evaluation. Latching circuits and vent comparators in each stage would turn off their respective pull down device as each stage completes evaluation. Once the slowest stage has evaluated it allows CompleteEvaluate 1806 to again go high indicating that the MSPVDLB 1800 had completed a cycle. Completing a computation cycle would then trigger a ComputationCompleted 1805. If computation is complete, another ComputationRequest 1801 signal may initiate another computation cycle asynchronously with particular system clock edges. MSPVDLB 1800, using embodiments of the present invention, operates in a self-timed mode and a clock speed would not have to be anticipated before hand, rather MSPVDLB 1800 would run at a speed determined by the slowest of its stages. Improvements in the speed of the slowest stage would enable an overall higher pipeline processing speed without having to re-adjust clock timing. Likewise speed variations in a MSPVDLB 1800 that occurred from one IC to another would not require a corresponding adjusted clock. The key to the operation of the self-timed MSPVDLB is using embodiments of the present invention. VCMOS and vent comparators enable circuitry to establish when individual stages have pre-charged or vented and when they have completed a computation or evaluation. Each pipeline stage may signal its stage buffer that a result is ready to be latched into a master of a stage buffer. Likewise, a start evaluation signal may indicate when a master of a stage buffer transfers its data to the stage buffer output (slave) for application to a PVDLB stage.

Figure 14:
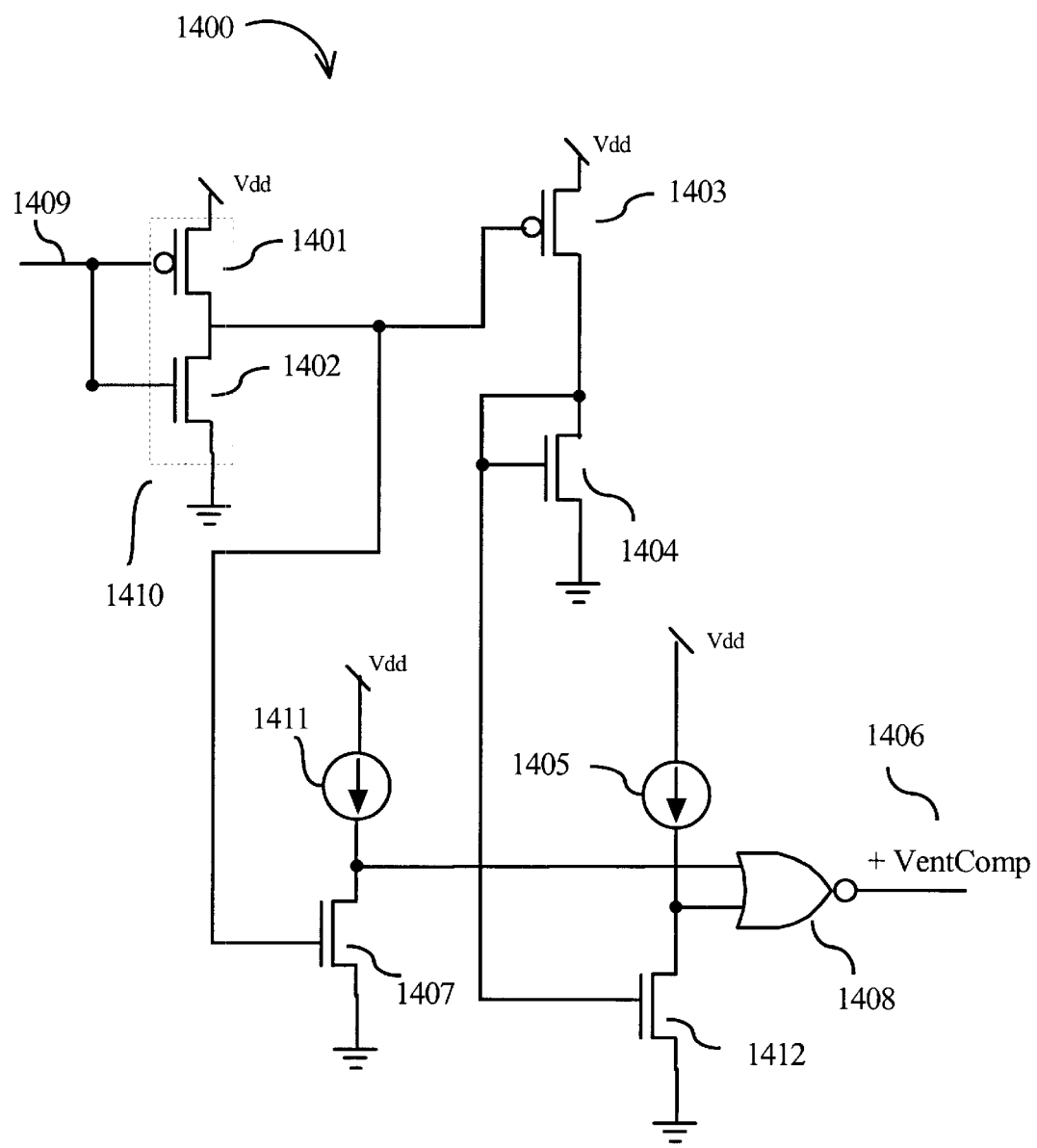
FIG. 14 is a circuit diagram of a vent comparator useable in embodiments of the present invention.

FIG. 14 is a circuit diagram of a vent comparator 1400 that may be used in embodiments of the present invention.

PFET 1401 and NFET 1402 comprise a "sense" inverter 1410 that is coupled to the output of a selected gate where a vent comparator is desired. This sense inverter 1410 has an input but its logic output is not used in a logic sense; rather the output is used to sense the states of conduction of PFET 1401 and NFET 1402. Node 1409, of sense inverter 1410, is coupled to the output of a selected VCMOS gate which, during the course of operation of a VCMOS logic function, will be in a logic state (one or zero) or in an intermediate state (vent state). Coupling this output to node 1409 of sense inverter 1410 causes it to also be in a corresponding logic state (one or zero) or an intermediate state (vent state). When the sense inverter 1410 is in a logic state (one or zero), neither PFET 1401 nor NFET 1402 is conducting current except during a transition time, going from a logic one to a logic zero or visa versa. During a transition time both PFET 1401 and NFET 1402 are conducting for only a short period of time. In a vent state, both PFET 1401 and NFET 1402 are conducting. Because of the high gain of the transition region and the fact that it is difficult for the sense inverter to be outside of the vent region for long without making a transition to a logic one or zero, most of the time only two states are necessary to determine the vent and logic state of a gate. If additional safety margin are desired, the vent comparator may be designed to have a third state dependent on voltage as well as current. In this embodiment of the vent comparator the circuit would have to be outside the vent region and also be at a particular voltage to be considered in a logic state. In other embodiments of the present invention, detecting the simultaneous current flow in PFET 1401 and NFET 1402 during a vent state of sense inverter 1410 provides a means of determining when a corresponding VCMOS logic gate is also in the vent state.

By coupling a PFET 1403 in parallel (common gate and common drain) to PFET 1401, the current in PFET 1401 maybe sensed or mirrored by PFET 1403 which will function as a current source. The PFET 1403 in turn drives NFET 1404 configured as an active resistor device. The current in NFET 1404 is in turn current mirrored to NFET 1412. Current mirroring refers to the fact that if one FET is conducting current and a second FET is placed in parallel with common gates and sources, device matching causes the second FET to conduct or "mirror" the same current as the first FET. The current in NFET 1402 is current mirrored by transistor 1407. Active pull ups, shown as current source 1405 and 1411, are coupled to NFET 1407 and NFET 1412 respectively. The active pull-up current sources 1405 and 1411 are sized to have a current less than the current mirrored by a FET in sense inverter 1410 during either a logic state or a vent state. The only time that both transistors 1401 and 1402 are concurrently conducting current is in the vent state, therefore the output of logic NOR gate 1408 will be at a logic one only during a vent state. When sense inverter 1410 is sensing a logic state (either a one or zero) mirror devices NFET 1407 and 1412 are not both sensing current and therefore signal VentComp 1406 will be low indicating a logic state. There may be other particular vent comparator circuits that may be constructed and used and still be within the scope of embodiments of the present invention.

Figure 22A:
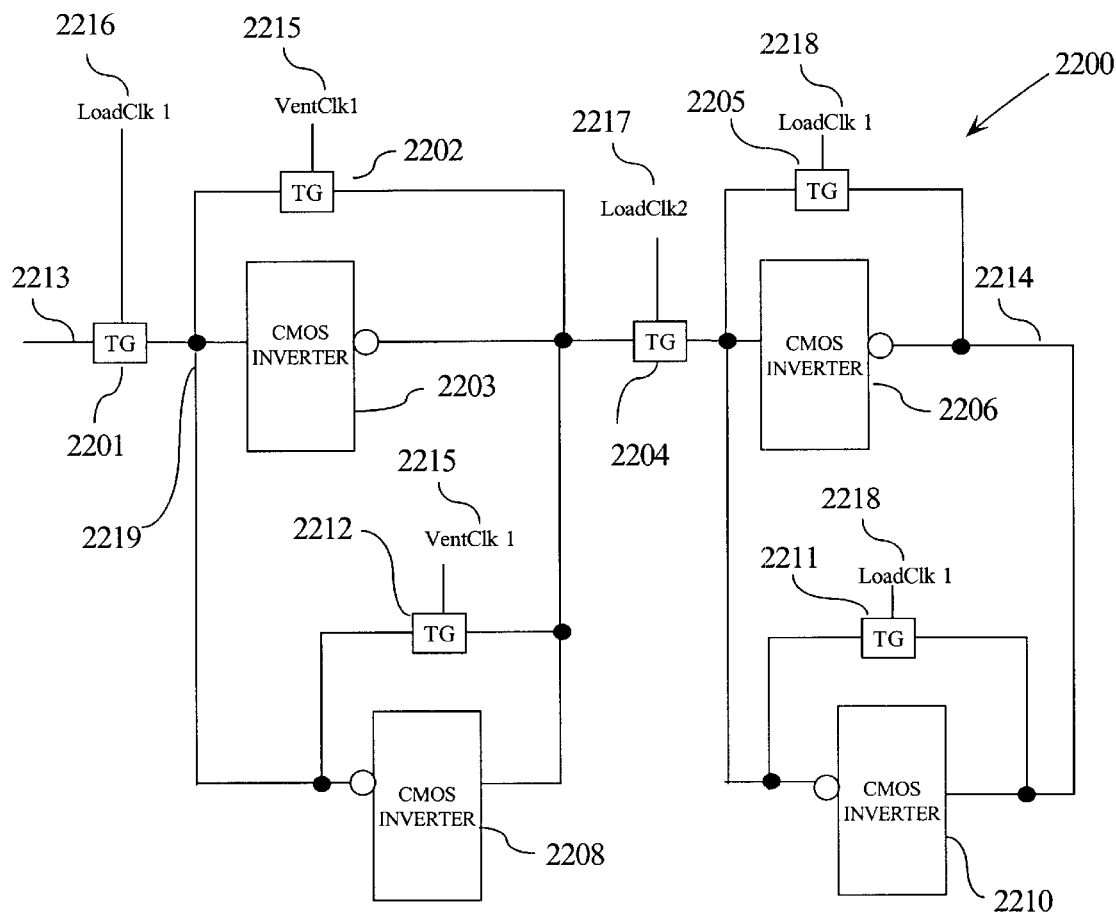
FIG. 22A is a circuit diagram of a master-slave flip-flop using embodiments of the present invention.

FIG. 22A illustrates another embodiment of the present invention utilizing interconnection of VCMOS in an embodiment of a VDLB structure. In this embodiment, CMOS inverter 2203 and TG 2202 make up a VCMOS with VCMOS input 2219. One side of TG 2201 is a VDLB input 2213. VentClk2 2215 vents CMOS inverter 2203. CMOS inverter 2206 and TG 2205 also make up an VCMOS where the output of CMOS inverter 2206 is a VDLB output 2214. CMOS inverter 2208 and TG 2212 make up a VCMOS whose output is coupled to VCMOS input 2219. CMOS 2210 and TG 2211 make up a VCMOS with VCMOS output 2218. With the clocking shown in FIG. 22B, VDLB circuit 2200 operates as a logic master-slave flip-flop implemented using embodiments of the present invention. CMOS inverter 2203 is vented with VentClk1 2215 to start a latch cycle. LoadClk1 2216 transitions to a logic one turning on transmission gate (TG) 2201, which applies a logic signal to the input of CMOS inverter 2203. The output of CMOS inverter 2203 is inverted by CMOS 2208 and reinforces the applied input signal. When LoadClk1 2216 transitions to a logic zero TG 2201 turns off and the data is latched by the circuit comprising CMOS inverters 2203 and 2208 (master of the flip-flop). LoadClk2 2217 then transitions to a logic one thus making TG 2204 conducting and thus coupling the logic state of the master (CMOS inverters 2203 and 2208) into the circuit comprising CMOS inverters 2206 and 2210 (slave of the flip-flop). When LoadClk2 2217 transitions to a logic zero a new load cycle may begin. In this embodiment, CMOS inverters 2206 and 2210 are vented during LoadClk1 2216 when TG 2204 has isolated the master from the slave section of the flip-flop. In the embodiment in FIG. 22A, feedback CMOS inverters 2208 and 2210 would normally be designed as "weak" inverters which function only to maintain the charge state on nodes 2219 and 2218 respectively.

Figure 23A:
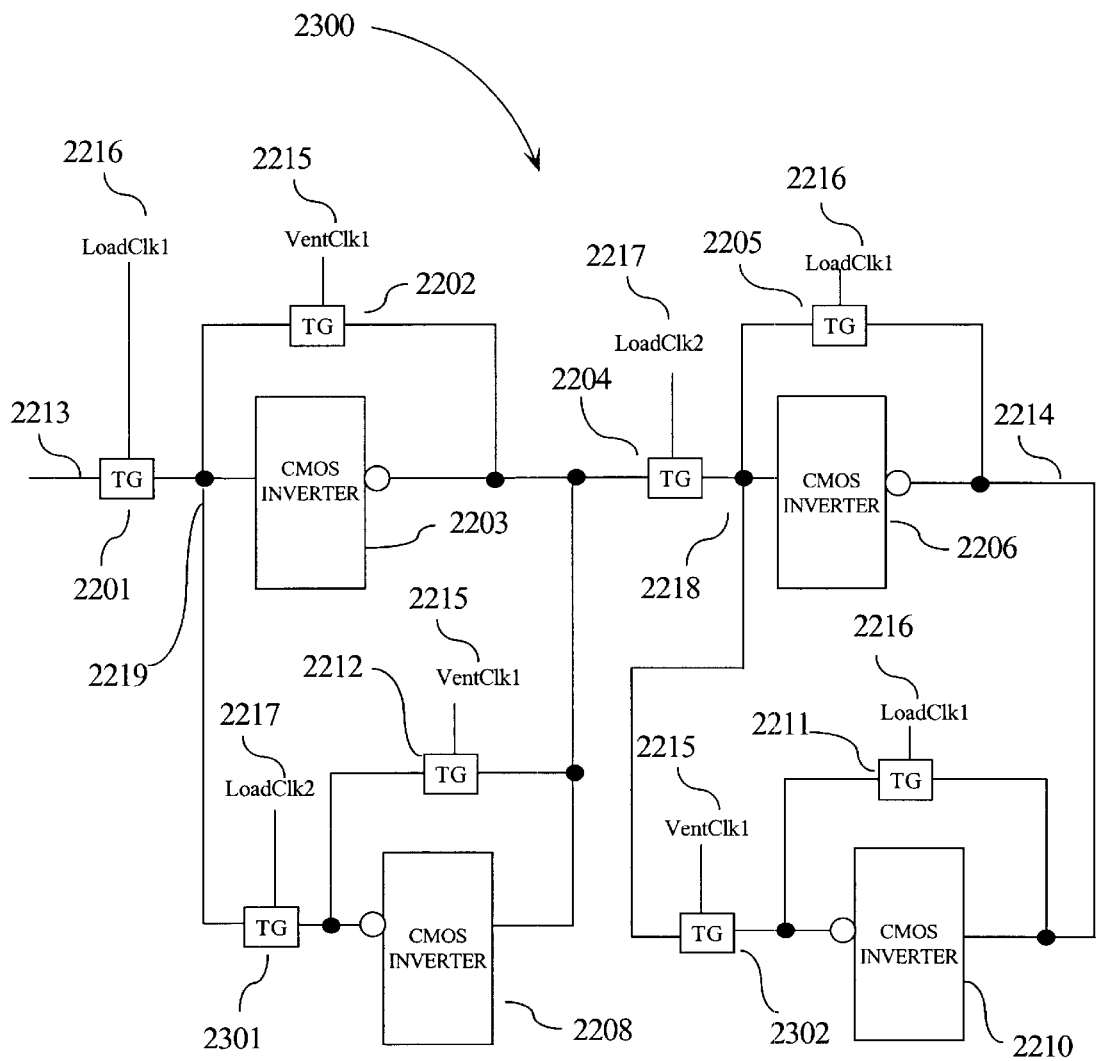
FIG. 23A is a circuit diagram of a master-slave flip-flop using another embodiment of the present invention.

FIG. 23A is a circuit diagram of a master-slave flip-flop 2300 another embodiment of the present invention. In this embodiment TG 2301 is added in series with the output of CMOS inverter 2208 and is gated by LoadClk2 2217. Likewise TG 2302 is coupled in series with the output of CMOS inverter 2210. In this embodiment TG 2301 and 2302 function to isolate the feedback path of the master storage unit comprising CMOS inverters 2203 and 2208 and slave store unit comprising CMOS inverters 2206 and 2210 respectively from applied signals to nodes 2219 and 2218 respectively. This isolation prevents the feedback CMOS inverters 2208 and 2210 from "competing" with the applied inputs to nodes 2219 and 2218.

Other circuit configurations where VCMOS, IVCMOS and OVCMOS are interconnected to realize specialized logic functions using either BDES switch isolation or timing isolation.

Figure 19:
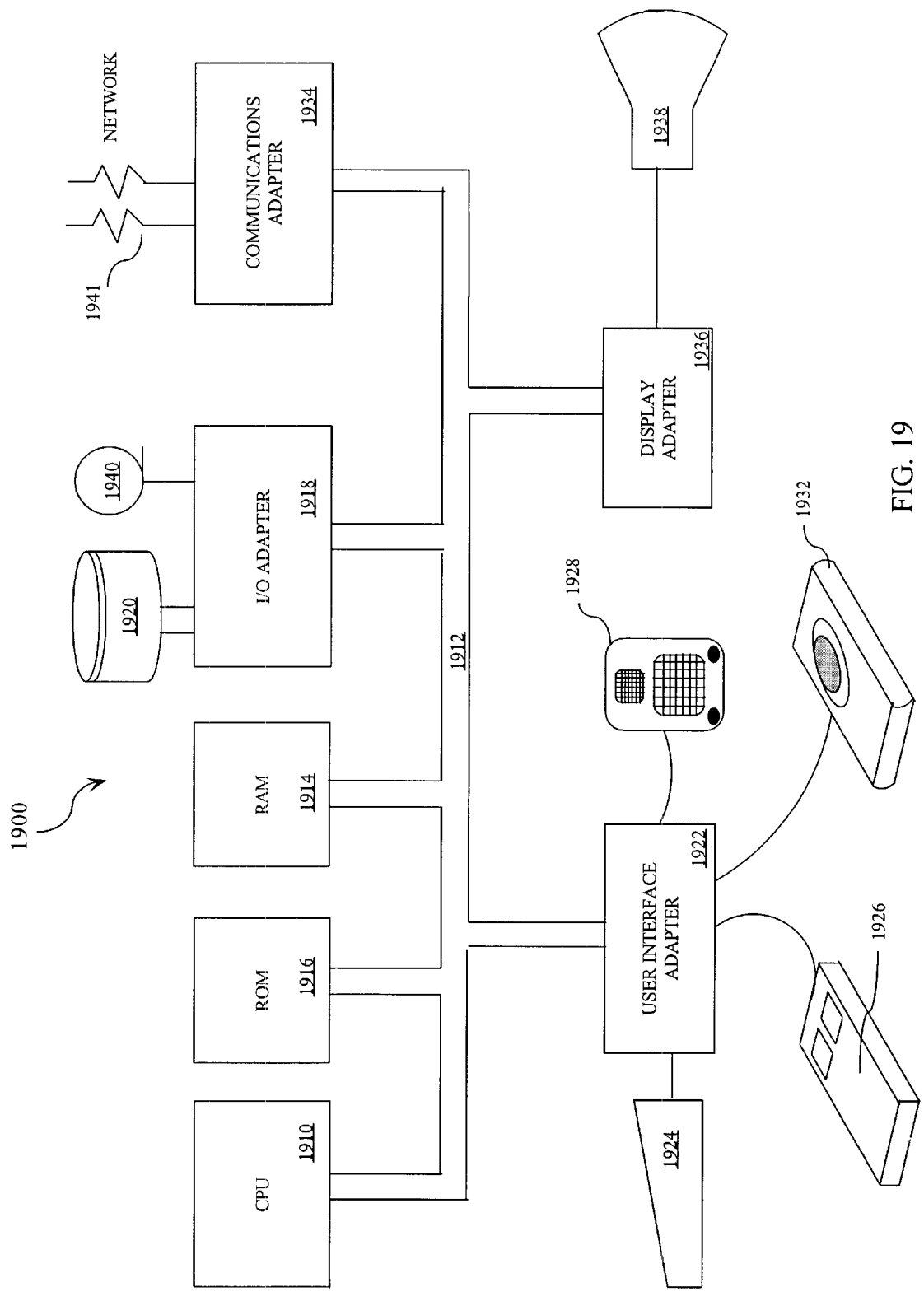
FIG. 19 is a block diagram of a data processing system which may be implemented with embodiments of the present invention.

A representative environment for practicing the present invention is depicted in FIG. 19, which illustrates a typical hardware configuration of a workstation 1900 in accordance with the subject invention having central processing unit (CPU) 1910, such as a conventional microprocessor, and a number of other units interconnected via system bus 1912. The workstation shown in FIG. 19 includes random access memory (RAM) 1914, read only memory (ROM) 1916, and input/output (I/O) adapter 1918 for connecting peripheral devices such as disk units 1920 and tape drives 1940 to bus 1912, user interface adapter 1922 for connecting keyboard 1924, mouse 1926, speaker 1928, microphone 1932, and/or other user interface devices such as a touch screen device (not shown) to bus 1912, communication adapter 1934 for connecting the workstation to a data processing network 1941, and display adapter 1936 for connecting bus 1912 to display device 1938. CPU 1910 may include other circuitry not shown herein, which will include circuitry commonly found within a microprocessor, e.g., execution unit, bus interface unit, arithmetic logic unit, etc. CPU 1910 may also reside on a single integrated circuit. The CPU 1910 may employ logic and pipeline logic structures which uses embodiments of the present invention. In those sections of the CPU's logic where speed and pipelined logic architecture is important, timed and self-timed circuits using embodiments of the present invention may be particularly useful.

Figure 20:
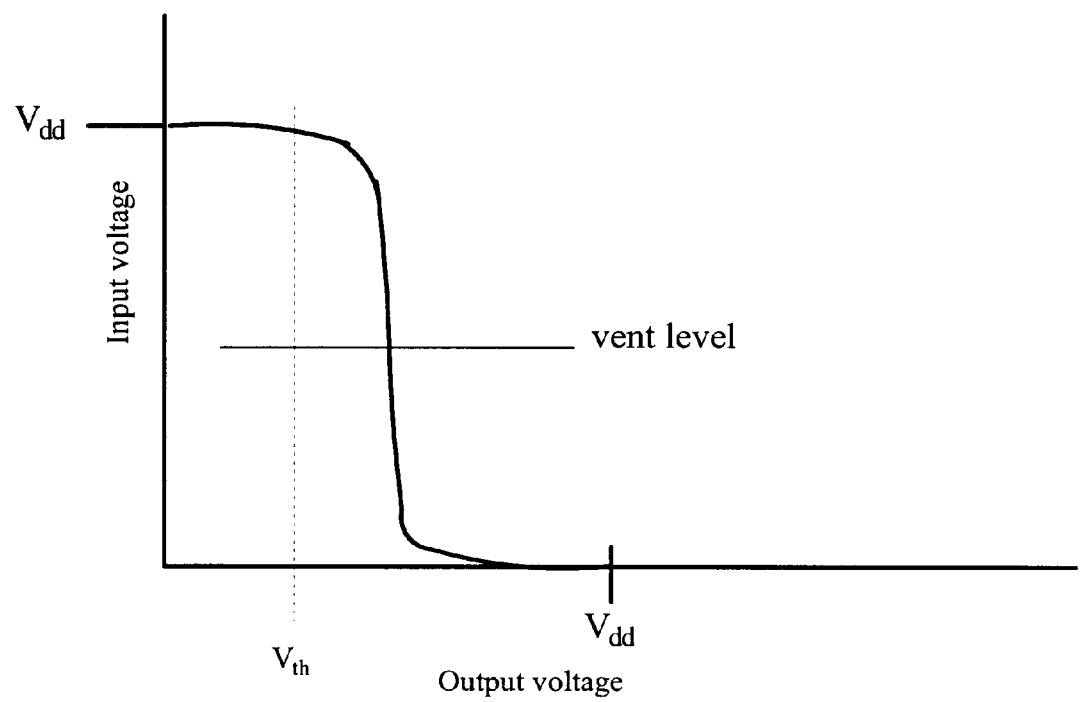
FIG. 20 illustrates a typical voltage in versus voltage out of a CMOS inverter.

FIG. 20 illustrates a input/output voltage transfer function of an VCMOS inverter (not shown). When the VCMOS is vented the vent level is typically one-half the input and output maximum voltage levels (Vdd).

Although the present invention and its advantages have been described in detail, it should be understood that various changes, substitutions and alterations can be made herein without departing from the spirit and scope of the invention as defined by the appended claims.

What is claimed is:

1. A vented dynamic logic gate (VCMOS) comprising:
   a first bidirectional electronic switch (BDES), said first BDES having a first node and a second node, said first BDES operable to be gated on during a first vent clock time and off during a second vent clock time;
   a first inverting logic gate having a first input, a second input, and a logic output, wherein said first node is coupled to said first input and said second node is coupled to said logic output, said first input a first VCMOS input and said logic output a VCMOS output; and
   a second bidirectional electronic switch (BDES), said second BDES having a third node and a fourth node, said second BDES operable to be gated on during said first vent clock time and off during said second vent clock time, wherein said third node is coupled to said second input and said fourth node is coupled to said logic output, said second input a second VCMOS input.

2. The VCMOS in claim 1, wherein said inverting logic gate comprises a complementary metal oxide silicon (CMOS) inverting logic gate.

3. The VCMOS in claim 1, wherein said first BDES comprises a CMOS transmission gate, a NMOS transistor or a PMOS transistor.

4. The VCMOS in claim 1, wherein a first logic signal is applied to said first input during said second vent clock time and not applied to said first input during said first vent clock time.

5. The VCMOS in claim 1, wherein said first input and said logic output of said VCMOS transition to an intermediate voltage state during said first vent clock time.

6. The VCMOS in claim 4, wherein said logic output transitions to a logic one or a logic zero voltage level in response to said first logic signal applied to said first input during said second vent clock time.

7. The VCMOS is claim 1, wherein said second BDES comprises a CMOS transmission gate, an NMOS transistor or a PMOS transistor.

8. The VCMOS in claim 1, wherein said first and second logic signal are applied to said first input and said second input respectively during said second vent clock time and not applied to said first input and said second input during said first vent clock time.

9. The VCMOS in claim 1, wherein said first input, said second input and said logic output of said VCMOS transition to an intermediate voltage state during said first vent clock time.

10. The VCMOS in claim 8, wherein said logic output transitions to a logic one or a logic zero voltage level in response to said first and second logic signal applied to said first and second input respectively during said second vent clock time.

11. An input vented dynamic logic gate (IVCMOS) comprising;
    a first bidirectional electronic switch (BDES), said first BDES having a first node and a second node, said first BDES operable to be gated on during a first vent clock time and off during a second vent clock time;
    a second BDES, said second BDES having a third node and a fourth node, said second BDES operable to be gated off during a third vent clock time and on during a fourth vent clock time; and
    an inverting logic gate having a first input and a logic output, wherein said first node is coupled to said first input, said second node is coupled to said logic output, said fourth node is coupled to said first input, wherein said third node is an IVCMOS input, said fourth node is a VCMOS input and said logic output is a IVCMOS output.

12. The IVCMOS in claim 11, wherein said inverting logic gate is a complementary metal oxide silicon (CMOS) inverting logic gate.

13. The IVCMOS in claim 11, wherein said first BDES and second BDES comprise CMOS transmission gates, NMOS transistors, or PMOS transistors.

14. The IVCMOS in claim 11, wherein said first vent clock time is within said third vent clock time and said fourth vent clock time is within said second vent clock time.

15. The IVCMOS in claim 11, wherein said logic output and said first input transition to an intermediate voltage state during said first vent clock time.

16. The IVCMOS of claim 11, wherein said second BDES selectively couples a first logic signal to said first input during said fourth vent clock time and selectively isolates said first logic signal from said first input during said third vent clock time.

17. The IVCMOS of claim 11, wherein said logic output transitions to a logic one or a logic zero in response to said first logic signal applied to said first input during said fourth vent clock time.

18. An output vented dynamic logic gate (OVCMOS) comprising:
    a first bidirectional electronic switch (BDES), said first BDES having a first node and a second node, said first BDES operable to be gated on during a first vent clock time and off during a second vent clock time;
    a second BDES, said second BDES having a third node and a fourth node, said second BDES operable to be gated off during a third vent clock time and on during a fourth vent clock time; and
    an inverting logic gate having a first input and a logic output, wherein said first node is coupled to said first input, said second node is coupled to said logic output and said fourth node is coupled to said logic output, wherein said third node is an OVCMOS output, said first node is an OVCMOS input and said logic output is a VCMOS output.

19. The OVCMOS in claim 18, wherein said inverting logic gate is a complementary metal oxide silicon (CMOS) inverting logic gate.

20. The OVCMOS in claim 18, wherein said first and second BDES comprise CMOS transmission gates, NMOS transistors, or PMOS transistors.

21. The OVCMOS in claim 18, wherein said first vent clock time is within said third vent clock time and said fourth vent clock time is within said second vent clock time.

22. The OVCMOS in claim 18, wherein said logic output and said first input of said OVCMOS transition to an intermediate voltage state during said first vent clock time.

23. The OVCMOS in claim 18, wherein said logic output transitions to a logic one or a logic zero voltage level in response to a first logic signal applied to said first input during said second vent clock time.

24. The OVCMOS in claim 23, wherein said logic output is coupled from said OVCMOS during said fourth vent clock time.

25. A Vented Dynamic Logic Block (VDLB) comprising:
a plurality VDLB inputs, said VDLB inputs coupled to input vented dynamic logic gate (IVCMOS) inputs, vented dynamic logic gate (VCMOS) inputs, or output vented dynamic logic gate (OVCMOS) inputs, each of said IVCMOS comprising:
a first bidirectional electronic switch (BDES), said first BDES having a first node and a second node, said first BDES operable to be gated on during a first vent clock time and off during a second vent clock time;
a second BDES, said second BDES having a third node and a fourth node, said second BDES operable to be gated off during a third vent clock time and on during a fourth vent clock time; and
a first inverting logic gate having a first input and a first logic output, wherein said first node is coupled to said first input, said second node is coupled to said first logic output, said fourth node is coupled to said first input, wherein said third node is an IVCMOS input, said fourth node is a VCMOS input and said first logic output is an IVCMOS output,
a plurality of VDLB outputs, said VDLB outputs coupled to input vented dynamic logic gate (IVCMOS) outputs, vented dynamic logic gate (VCMOS) outputs, or output vented dynamic logic gate (OVCMOS) outputs, each of said OVCMOS comprising;
a third bidirectional electronic switch (BDES), said third BDES having a fifth node and a sixth node, said third BDES operable to be gated on during a first vent clock time and off during a second vent clock time;
a fourth BDES, said fourth BDES having a seventh node and a eighth node, said fourth BDES operable to be gated off during a third vent clock time and on during a fourth vent clock time; and
a second inverting logic gate having a second input and a second logic output, wherein said fifth node is coupled to said second input, said sixth node is coupled to said second logic output, said eighth node is coupled to said second logic output, wherein said seventh node is a OVCMOS output, said second logic input is a OVCMOS input and said second logic output is a VCMOS output;
a plurality vented dynamic logic (VCMOS) gates, each said VCMOS gates comprising:
a fifth bidirectional electronic switch (BDES), said fifth BDES having a ninth node and a tenth node, said fifth BDES operable to be gated on during a first vent clock time and off during a second vent clock time; and
a third inverting logic gate having a third input and a third logic output, wherein said ninth node is coupled to said third input and said tenth node is coupled to said third logic output, said third input is a VCMOS input and said third logic output is a VCMOS output,
wherein first selected VCMOS inputs are coupled to first selected IVCMOS outputs or first selected VCMOS outputs and second selected VCMOS outputs are coupled to first selected OVCMOS inputs and second selected OVCMOS outputs are coupled to second selected VCMOS inputs.

26. The VDLB in claim 25, wherein said first, second and third inverting logic gates are complementary metal oxide silicon (CMOS) inverting logic gates.

27. The VDLB in claim 25, wherein said first, second, third, fourth, and fifth, BDES are CMOS transmission gates, NMOS transistors, or PMOS transistors.

28. The VDLB in claim 25, wherein said first vent clock time is within said third vent clock time and said fourth vent clock time is within said second vent clock time.

29. The VDLB in claim 25, wherein said first, second, and third logic outputs and said first, second and third inputs of said VDLB transition to an intermediate voltage state during said first vent clock time.

30. The VDLB in claim 25, wherein said intermediate voltage state is detected in a vent comparator circuit, the output of said vent comparator circuit generating a first logic state when a selected VCMOS, IVCMOS or OVCMOS within said VDLB is in said intermediate voltage state and generating a second logic state when said corresponding selected VCMOS, IVCMOS or OVCMOS is not in an intermediate voltage state.

31. The VDLB in claim 30, wherein said vent comparator circuit is used to determine when a logic state has reached a position along a sequence of said VCMOS, IVCMOS or OVCMOS.

32. The VDLB in claim 30, wherein said vent comparator circuit is used to determine when a vent state has reached a position along a sequence of said VCMOS, IVCMOS or OVCMOS.

33. A Pipeline Vented Dynamic Logic Block (PVDLB) said PVDLB comprising:
one or more coupled Vented Dynamic Logic Blocks (VDLB), each of said VDLB comprising:
one or more VDLB inputs, said VDLB inputs coupled to inputs of input Vented CMOS (IVCMOS), each of said IVCMOS comprising:
a first BDES, said first BDES operable to be gated on during a first vent clock time and off during a second vent clock time;
a second BDES, said second BDES operable to be gated off during a third vent clock time and on during a fourth vent clock time; and
a first inverting logic gate having a first input and a logic output, wherein said first BDES is coupled between said first input and said logic output and said second BDES is coupled in series with said first input,
one or more VDLB outputs coupled to outputs of output vented CMOS (OVCMOS), each of said OVCMOS comprising:
a third BDES, said third BDES operable to be gated on during said first vent clock time and off during said second vent clock time;
a fourth BDES, said fourth BDES operable to be gated off during said third vent clock time and on during said fourth vent clock time; and
a second inverting logic gate having a second input and a second logic output, wherein said third BDES is coupled between said second input and said second logic output and said fourth BDES is coupled in series with said second output;
one or more vented CMOS (VCMOS), each of said VCMOS comprising:
a fifth BDES, said fifth BDES operable to be gated on during said first vent clock time and off during said second vent clock time; and
a third inverting logic gate having a third input and a third logic output, wherein said fifth BDES is coupled between said third input and said third logic output, wherein further first inputs of said VCMOS gates are coupled to selected outputs of said IVCMOS and second inputs of said VCMOS gates are coupled to first selected outputs said VCMOS gates and second selected outputs of said VCMOS gates are coupled to said inputs of said OVCMOS;

a clock logic circuit, said clock logic circuit receiving a first and second clock input and generating a vent clock signal, an I/O vent clock signal and a latch signal; and a first input latch circuit with one or more first latch inputs and first latch outputs, each of said first latch outputs coupled to each one of said PVDLB inputs, said first input latch circuit operable to store logic input signals coupled to said first latch inputs and present said stored logic input signals to said PVDLB in response to said latch signal.

34. The PVDLB in claim 33 further comprising:

a second output latch circuit with one or more second latch inputs and second latch outputs, each said second latch inputs coupled to each one of said PVDLB outputs, said second output latch circuit operable to store logic output signals coupled to said second latch inputs from said PVDLB in response to said latch signal.

35. The PVDLB in claim 33, wherein said third vent clock time begins before said first vent clock time and said first vent clock time stops before said third vent clock time.

36. The PVDLB in claim 33, wherein said second vent clock time begins before said fourth vent clock time and said second vent clock time ends after said fourth vent clock time.

37. The PVDLB in claim 33, wherein said third vent clock time starts on a first transition of a system clock signal and said first vent clock time starts in response to said start of said third vent clock time.

38. The PVDLB in claim 33, wherein said second vent clock time begins in response to the ending of said first vent clock time and said fourth vent clock time begins in response to the starting of said second vent clock time.

39. The PVDLB in claim 34, wherein said first input latch circuit and said second output latch circuit store data in response to said first transition of said system clock.

40. The PVDLB in claim 33, wherein said first, second, and third inverting logic gates are complementary metal oxide silicon (CMOS) inverting logic gates.

41. The PVDLB in claim 33, wherein said first, second, third, fourth, and fifth BDES are CMOS transmission gates, NMOS transistors or PMOS transistors.

42. The PVDLB in claim 33, wherein each output and each input of said IVCMOS, VCMOS and OVCMOS, transition to an intermediate voltage state during said first vent clock time.

43. The PVDLB in claim 33, wherein said intermediate voltage state is detected in a vent comparator circuit, the output of said vent comparator circuit generating a first logic state when a selected IVCMOS, VCMOS or OVCMOS within a first VDLB in said PVDLB is in said intermediate voltage state and generating a second logic state when said selected IVCMOS, VCMOS or OVCMOS is not in said intermediate voltage state.

44. The PVDLB in claim 33, wherein said first input latch circuit and said second output latch circuit comprise master-slave latches, said master-slave latches operable to store data into master latches on a first transition of a logic store signal and transfer said stored data to slave latches on a second transition of said logic store signal.

45. The PVDLB in claim 43, wherein said vent comparator is used with other logic to determine when to start a vent cycle of said PVDLB and when to start an evaluation cycle of said PVDLB.

46. The PVDLB of claim 43, wherein said vent comparator circuit comprises:

a sensing inverter, an input to said sensing inverter coupled to a VCMOS gate in said VDLB;

a first current sensing circuit coupled to a PFET in an output stage of said sensing inverter, said first current sensing circuit operable to generate a first current output when current is flowing in said PFET;

a second current sensing circuit coupled to a NFET in said output stage of said sensing inverter, said second current sensing circuit operable to generate a second current output when current is flowing in said NFET; and a logic AND circuit receiving said first current output and said second current output and generating a logic one vent output when said current is flowing concurrently in said PFET and said NFET.

47. The IVCMOS of claim 11, wherein said IVCMOS further comprises:

a third BDES, said third BDES having a fifth node and a sixth node, said third BDES operable to be gated on during said first vent clock time and off during said second vent clock time;

said first inverting logic gate having a second input wherein said fifth node is coupled to said second input and said sixth node is coupled to said logic output; and a fourth BDES, said fourth BDES having a seventh node and an eighth node, said fourth BDES operable to be gated off during said third vent clock time and on during said fourth vent clock time, wherein said seventh node is coupled to said second input and said eighth node is an IVCMOS input.

48. The OVCMOS of claim 18, wherein said OVCMOS further comprises:

a third BDES, said third BDES having a fifth node and a sixth node, said third BDES operable to be gated on during said first vent clock time and off during said second vent clock time;

said first inverting logic gate having a second input wherein said fifth node is coupled to said second input and said sixth node is coupled to said logic output; and a fourth BDES, said fourth BDES having a seventh node and an eighth node, said fourth BDES operable to be gated off during said third vent clock time and on during said fourth vent clock time, wherein said seventh node is coupled to said logic output and said eighth node is a second OVCMOS output.

* * * * *

UNITED STATES PATENT AND TRADEMARK OFFICE
CERTIFICATE OF CORRECTION

Figure 22B:
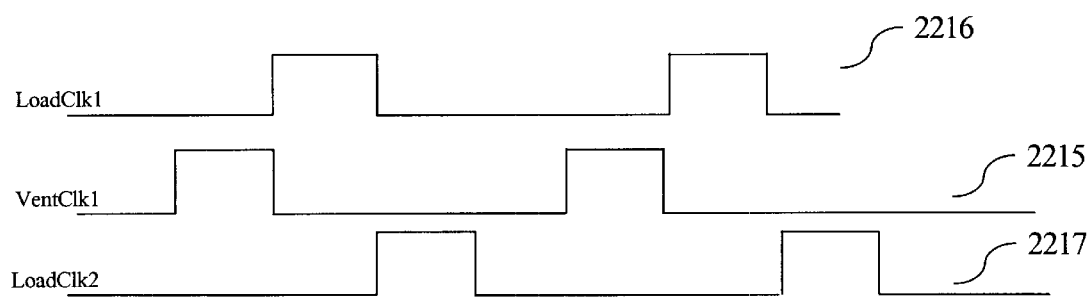
FIG. 22B is a timing diagram of the clocks for the circuit in FIG. 22A.
Figure 23B:
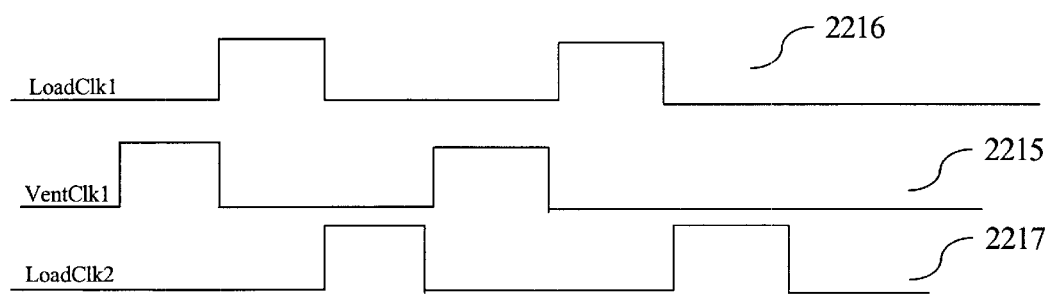

PATENT NO. : 6,420,905 B1
DATED : July 16, 2002
INVENTOR(S) : John Haven Davis and Zachary Booth Simpson It is certified that error appears in the above-identified patent and that said Letters Patent is hereby corrected as shown below:

Column 4,
Line 55, please replace "FIG. 22B" with -- FIG. 23B --.

Column 6,
Line 2, please replace "Ti" with -- T1 --.

Column 8,
Line 11, please replace "WVCMOS" with -- IVCMOS --.
Line 35, please replace "inlogic" with -- logic --.

Column 15,
Line 51, please replace "is" with -- in --.

Column 16,
Line 35, please replace "11" with -- 16 --.

Signed and Sealed this

Thirteenth Day of May, 2003

JAMES E. ROGAN
*Director of the United States Patent and Trademark Office*